US012581749B2

(12) United States Patent
Guo et al.

(10) Patent No.: US 12,581,749 B2
(45) Date of Patent: Mar. 17, 2026

(54) PHOTOVOLTAIC MODULE AND METHOD FOR MANUFACTURING PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Zhiqiu Guo, Haining (CN); Liqin Liu, Haining (CN); Chi Zhang, Haining (CN); Shiliang Huang, Haining (CN); Guohui Hao, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 297 days.

(21) Appl. No.: 18/309,703

(22) Filed: Apr. 28, 2023

(65) Prior Publication Data

US 2024/0243210 A1      Jul. 18, 2024

(30) Foreign Application Priority Data

Jan. 16, 2023     (CN) .......................... 202310111863.5
Jan. 16, 2023     (CN) .......................... 202310116607.5

(51) Int. Cl.
*H10F 19/80*          (2025.01)
*H10F 71/00*          (2025.01)

(52) U.S. Cl.
CPC ......... *H10F 19/80* (2025.01); *H10F 71/1375* (2025.01)

(58) Field of Classification Search
CPC .............................. H10F 19/80; H10F 71/1375
See application file for complete search history.

(56) References Cited

U.S. PATENT DOCUMENTS 9,484,479 B2    11/2016  Hamaguchi et al.
9,490,382 B2    11/2016  Hashimoto et al.
(Continued)

FOREIGN PATENT DOCUMENTS

CN        105702794 A       6/2016
CN        105702796 A       6/2016
(Continued)

OTHER PUBLICATIONS

Machine translation of CN-115050850-A, Chen, Hong-yue. (Year: 2022).*

(Continued)

*Primary Examiner* — Mayla Gonzalez Ramos
(74) *Attorney, Agent, or Firm* — USCH Law, PC

(57) ABSTRACT

A photovoltaic module and a method for manufacturing the photovoltaic module are provided. A respective solar cell has a front surface and a rear surface opposite to the front surface, each of which has a plurality of electrodes formed thereon. Each connection member of the plurality of connection members is configured to connect two adjacent solar cells of the plurality of solar cells and has a first end portion disposed over the front surface of a first solar cell of the two adjacent solar cells and a second end portion disposed over the rear surface of a second solar cell of the two adjacent solar cells. Each encapsulation layer includes a first encapsulation sub-layer and a second encapsulation sub-layer, where flowability of the first encapsulation sub-layer is smaller than flowability of the second encapsulation sub-layer.

18 Claims, 5 Drawing Sheets

(56) References Cited

U.S. PATENT DOCUMENTS

| | | | |
|---|---|---|---|
| 10,872,992 B2 | 12/2020 | Gragert et al. | |
| 2007/0235077 A1 | 10/2007 | Nagata et al. | |
| 2008/0121266 A1 | 5/2008 | Tsunomura et al. | |
| 2009/0032081 A1 | 2/2009 | Saita et al. | |
| 2009/0194148 A1 | 8/2009 | Taguchi | |
| 2015/0013768 A1* | 1/2015 | Odoi ...................... | H10F 19/80 |
| | | | 136/259 |
| 2020/0212233 A1 | 7/2020 | Hashimoto et al. | |

FOREIGN PATENT DOCUMENTS

| | | | | |
|---|---|---|---|---|
| CN | 107833934 A | | 3/2018 | |
| CN | 108419433 A | | 8/2018 | |
| CN | 110943140 A | | 3/2020 | |
| CN | 111081802 A | | 4/2020 | |
| CN | 111509069 A | | 8/2020 | |
| CN | 111628028 A | | 9/2020 | |
| CN | 212257422 U | | 12/2020 | |
| CN | 112289879 A | | 1/2021 | |
| CN | 213071154 U | | 4/2021 | |
| CN | 113035986 A | | 6/2021 | |
| CN | 214411224 U | | 10/2021 | |
| CN | 113698877 A | | 11/2021 | |
| CN | 214753801 U | | 11/2021 | |
| CN | 215418200 U | | 1/2022 | |
| CN | 114068733 A | | 2/2022 | |
| CN | 114068734 A | | 2/2022 | |
| CN | 114078980 A | | 2/2022 | |
| CN | 114093969 A | | 2/2022 | |
| CN | 114203836 A | | 3/2022 | |
| CN | 114447157 A | | 5/2022 | |
| CN | 114765229 A | | 7/2022 | |
| CN | 114806421 A | | 7/2022 | |
| CN | 114975660 A | | 8/2022 | |
| CN | 217334107 U | | 8/2022 | |
| CN | 115050850 A | * | 9/2022 | ............ H10F 71/00 |
| CN | 115241311 A | | 10/2022 | |
| CN | 217691187 U | | 10/2022 | |
| CN | 115260922 A | | 11/2022 | |
| CN | 115295650 A | | 11/2022 | |
| CN | 115295653 A | | 11/2022 | |
| CN | 115117206 B | | 12/2022 | |
| CN | 217983361 U | | 12/2022 | |
| CN | 115732580 A | | 3/2023 | |
| CN | 115763602 A | | 3/2023 | |
| CN | 115763603 A | | 3/2023 | |
| EP | 2657982 A1 | * | 10/2013 | ............ H10F 71/00 |
| JP | 2008258255 A | | 10/2008 | |
| JP | 2009248499 A | | 10/2009 | |
| JP | 2011074261 A | | 4/2011 | |
| JP | 2011074262 A | | 4/2011 | |
| JP | 2011077301 A | | 4/2011 | |
| JP | 2014058056 A | | 4/2014 | |
| JP | 2015185731 A | | 10/2015 | |
| JP | 2017537469 A | | 12/2017 | |
| JP | 2018082178 A | | 5/2018 | |
| JP | 2018515935 A | | 6/2018 | |
| JP | 2018113280 A | | 7/2018 | |
| JP | 2018530168 A | | 10/2018 | |
| JP | 2020088133 A | | 6/2020 | |
| JP | 2020531656 A | | 11/2020 | |
| KR | 1020170017576 A | | 2/2017 | |
| KR | 20230116750 A | | 8/2023 | |
| WO | 2012070245 A1 | | 5/2012 | |
| WO | 2014033829 A1 | | 3/2014 | |
| WO | 2014136204 A1 | | 9/2014 | |
| WO | 2014155418 A1 | | 10/2014 | |
| WO | 2015139516 A1 | | 9/2015 | |
| WO | 2016198797 A1 | | 12/2016 | |
| WO | 2017010385 A1 | | 1/2017 | |
| WO | 2021070743 A1 | | 4/2021 | |
| WO | 2022222628 A1 | | 10/2022 | |
| WO | 2023103260 A1 | | 6/2023 | |

OTHER PUBLICATIONS

Zhejiang Jinko Solar Co., Ltd., et al., Extended European Search Report, EP 23170534.4, Sep. 18, 2023, 9 pgs.

Jianbin Qin et al., "Experiments in Polymer Physics", Northwestern Polytechnical University Press, Aug. 2021, p. 55, 4 pgs.

Zhejiang Jinko Solar Co., Ltd., et al., KR First Office Action with English translation, KR 10-2023-0093426, Jul. 16, 2024, 16 pgs.

Zhejiang Jinko Solar Co., Ltd., et al., Non Final Rejection, U.S. Appl. No. 18/309,707, Sep. 6, 2024, 23 pgs.

Zhejiang Jinko Solar Co., Ltd et al., JP First Office Action with English translation, JP 2024-079320, Jan. 20, 2025, 14gs.

Zhejiang Jinko Solar Co., Ltd., et al., Examination report No. 1 for standard patent application, AU 2023202896, Feb. 14, 2024, 5 pgs.

Zhejiang Jinko Solar Co., Ltd., et al., CN Notification of grant of patent right for invention, CN 2023101118635, Mar. 22, 2024, 6 pgs.

Zhejiang Jinko Solar Co., Ltd., et al., Examination report No. 1 for standard patent application, AU 2023202640, Feb. 22, 2024, 11 pgs.

Zhejiang Jinko Solar Co., Ltd., et al., JP Decision to gant a patent, JP 2023092812, Feb. 21, 2024, 5 pgs.

Zhejiang Jinko Solar Co., Ltd., et al., Partial European Search Report, EP 23172558.1, Oct. 26, 2023, 14 pgs.

Zhejiang Jinko Solar Co., Ltd., et al., CN First Office Action with English translation, CN 202310116607.5, Dec. 4, 2023, 12 pgs.

Zhejiang Jinko Solar Co., Ltd., et al., CN First Office Action with English translation, CN 202310111863.5, Dec. 29, 2023, 12 pgs.

Zhejiang Jinko Solar Co., Ltd., et al., CN First Office Action with English translation, CN 202310089709.2, Dec. 4, 2023, 11 pgs.

* cited by examiner

PHOTOVOLTAIC MODULE AND METHOD FOR MANUFACTURING PHOTOVOLTAIC MODULE

CROSS REFERENCE TO RELATED APPLICATIONS

The present application claims the benefit of priority under the Paris Convention to Chinese Patent Application No. 202310111863.5 filed on Jan. 16, 2023 and Chinese Patent Application No. 202310116607.5 filed on Jan. 16, 2023, which are incorporated herein by reference in their entireties.

TECHNICAL FIELD

The various embodiments described in this document relate in general to technical field of photovoltaic, and more particularly to a photovoltaic module and a method for manufacturing the photovoltaic module.

BACKGROUND

With the development of photovoltaic technology, during manufacturing of photovoltaic cells or photovoltaic modules, improving the efficiency and yield of photovoltaic cells while saving manufacturing costs are becoming increasingly important.

As an important part of solar cells, electrodes are used to collect and export electrons generated by the photovoltaic effect, and welding strips are used to connect cells in the photovoltaic module. The arrangement and welding quality between the electrodes and the welding strips, materials of the welding strips and the electrodes, the welding manner between the welding strips and the electrodes, and an adhesive film on the welding strips all may affect the photoelectric conversion efficiency of the cells, the efficiency of the photovoltaic module, and the yield and the life of the photovoltaic module. At present, the arrangement of the electrodes, the welding strips, and the adhesive film in the photovoltaic module need to be improved.

SUMMARY

Embodiments of the disclosure provide a photovoltaic module and a method for manufacturing the photovoltaic module.

According to some embodiments of the disclosure, a photovoltaic module is provided. The photovoltaic module includes a plurality of solar cells, a plurality of connection members, and at least one encapsulation layer. A respective solar cell of the plurality of solar cells has a front surface and a rear surface opposite to the front surface, and the front surface and the rear surface each includes a plurality of electrodes formed thereon. Each connection member of the plurality of connection members is configured to connect two adjacent solar cells of the plurality of solar cells and has a first end portion disposed over the front surface of a first solar cell of the two adjacent solar cells and a second end portion disposed over the rear surface of a second solar cell of the two adjacent solar cells, and the first end portion is in contact with the plurality of electrodes on the front surface of the first solar cell, and the second end portion is in contact with the plurality of electrodes on the rear surface of the second solar cell. Each encapsulation layer of the at least one encapsulation layer includes a first encapsulation sub-layer and a second encapsulation sub-layer, the first encapsulation sub-layer is adjacent to the plurality of connection members and portions of the plurality of solar cells not covered by the plurality of connection members, and the second encapsulation sub-layer is on a surface of the first encapsulation sub-layer facing away from the plurality of solar cells, where flowability of the first encapsulation sub-layer is smaller than flowability of the second encapsulation sub-layer.

In some embodiments, a ratio of a minimum torque (ML) value of the first encapsulation sub-layer to a ML value of the second encapsulation sub-layer ranges from 1.5 to 8.5.

In some embodiments, a ML value of the first encapsulation sub-layer is in a range of 0.4 dN·m to 0.85 dN·m, and/or a ML value of the second encapsulation sub-layer is in a range of 0.1 dN·m to 0.3 dN·m.

In some embodiments, the photovoltaic module further includes a plurality of glue dots, where each glue dot is disposed between a corresponding solar cell and a corresponding connection member and disposed on a part of a surface of the corresponding solar cell outside the plurality of electrodes.

In some embodiments, the first encapsulation sub-layer and the second encapsulation sub-layer are integrally formed.

In some embodiments, a ratio of a thickness of the first encapsulation sub-layer to a maximum thickness of each connection member of the plurality of connection members ranges from 0.4 to 1, in a direction from the respective solar cell to a corresponding encapsulation layer of the at least one encapsulation layer (i.e., in a direction perpendicular to the front surface of each solar cell).

In some embodiments, a ratio of a thickness of the first encapsulation sub-layer to a thickness of the second encapsulation sub-layer is in a range of 0.3 to 1.5, in a direction from the respective solar cell to a corresponding encapsulation layer of the at least one encapsulation layer.

In some embodiments, each encapsulation layer further includes a third encapsulation sub-layer disposed on a surface of the second encapsulation sub-layer away from the plurality of solar cells, where flowability of the third encapsulation sub-layer is larger than the flowability of the first encapsulation sub-layer and the flowability of the second encapsulation sub-layer.

In some embodiments, a ratio of a ML value of the first encapsulation sub-layer to a ML value of the second encapsulation sub-layer is in a range of 1.1 to 3, and a ratio of the ML value of the second encapsulation sub-layer to the ML value of the third encapsulation sub-layer is in a range of 1.1 to 4.

In some embodiments, a ML value of the first encapsulation sub-layer is in a range of 0.4 dN·m to 0.85 dN·m, a ML value of the second encapsulation sub-layer is in a range of 0.3 dN·m to 0.4 dN·m, and/or a ML value of the third encapsulation sub-layer is in a range of 0.1 dN·m to 0.3 dN·m.

In some embodiments, a ratio of a thickness of the first encapsulation sub-layer to a thickness of the second encapsulation sub-layer is in a range of 1 to 4 in a direction from the respective solar cell to a corresponding encapsulation layer of the at least one encapsulation layer.

In some embodiments, a ratio of a thickness of the second encapsulation sub-layer to a thickness of the third encapsulation sub-layer is in a range of 0.2 to 0.7 in a direction from the respective solar cell to a corresponding encapsulation layer of the at least one encapsulation layer.

In some embodiments, the first encapsulation sub-layer and the second encapsulation sub-layer include a same material.

In some embodiments, the first encapsulation sub-layer, the second encapsulation sub-layer, and the third encapsulation sub-layer include a same material.

According to some embodiments of the disclosure, a method for manufacturing the photovoltaic module described in foregoing embodiments of the disclosure is provided. The method includes the following. The plurality of solar cells are provided. The plurality of connection members are disposed by disposing the first end portion of each connection member over the front surface of the first solar cell of the two adjacent solar cells and disposing the second end portion of the each connection member over the rear surface of the second solar cell of the two adjacent solar cells. The at least one encapsulation layer is disposed by disposing the first encapsulation sub-layer of each encapsulation layer adjacent to the plurality of connection members and portions of the plurality of solar cells not covered by the plurality of connection members and disposing the second encapsulation sub-layer on a surface of the first encapsulation sub-layer facing away from the plurality of solar cells. A lamination treatment is performed on the plurality of solar cells, the plurality of connection members, and the at least one encapsulation layer at a preset temperature, to enable the plurality of solar cells to be fixed with the at least one encapsulation layer.

In some embodiments, the method further includes the following during disposing the plurality of connection members. A plurality of glue dots are formed, where each glue dot is disposed between a corresponding solar cell and a corresponding connection member and disposed on a part of a surface of the corresponding solar cell outside the electrodes.

In some embodiments, each encapsulation layer further includes a third encapsulation sub-layer disposed on a surface of the second encapsulation sub-layer away from the plurality of solar cells, where flowability of the third encapsulation sub-layer is larger than the flowability of the first encapsulation sub-layer and the flowability of the second encapsulation sub-layer.

BRIEF DESCRIPTION OF THE DRAWINGS

One or more embodiments are described as examples with reference to the corresponding figures in the accompanying drawings and the exemplary illustration does not constitute a limitation to the embodiments. Unless otherwise stated, the figures in the accompanying drawings do not constitute a proportion limitation. In order to more clearly explain that embodiments of the disclosure or technical solutions in the conventional technique, the drawings required for use in the embodiments will be briefly described below, and it will be apparent that the drawings described below are only some of the embodiments of the disclosure, from which other drawings may be obtained without creative effort by a person of ordinary skill in the art.

DETAILED DESCRIPTION OF THE EMBODIMENTS

Figure 1A:
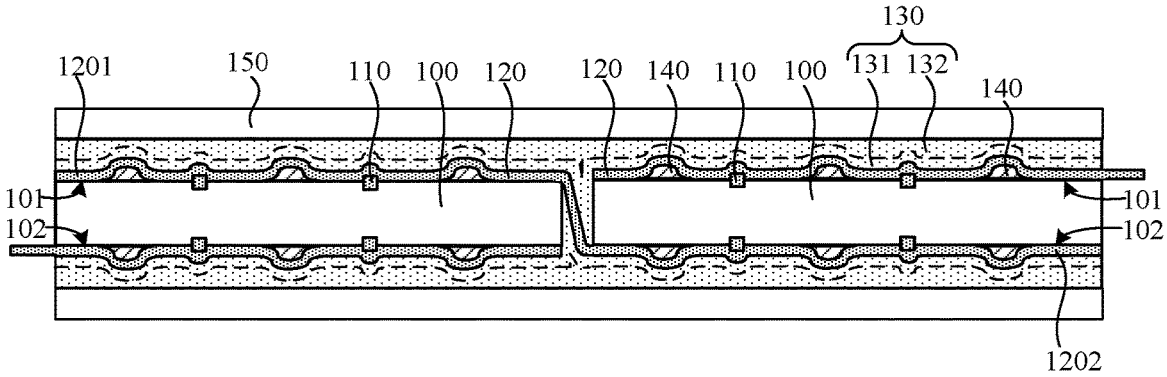
FIG. 1A is a schematic cross-sectional structural view of a photovoltaic module according to an embodiment of the disclosure.

In view of the above, arrangement of electrodes, welding strips, and adhesive films in photovoltaic modules needs to be improved.

The analysis found that when sunlight enters a solar cell from a surface of the solar cell, the electrodes on the surface of the solar cell may block the solar cell, and the light energy irradiated on the metal electrodes is not able to be converted into electric energy. Therefore, from the perspective of blocking the illumination, it is generally hoped that the electrode is relatively fine. The electrode is used to conduct current. From the perspective of resistivity, if the electrode is relatively fine, the conductive cross-sectional area of the electrode is relatively small, and thus the resistance loss is relatively large. Therefore, the electrode is designed to strike a balance between shading and conduction. In addition, in general, the paste for making the electrode mainly includes metal silver which is relatively expensive. During connecting soler cells into the module, it is necessary to weld a main bus bar (MBB) of each solar cell with a MBB of an adjacent solar cell through welding strips. Therefore, the relatively thick MBB is formed to ensure connection between the welding strips and the MBB. The higher material cost and the thicker MBB cause the higher preparation cost of the module. If the MBB is replaced by cheaper welding strips, and more and finer welding strips are directly connected with the finger electrodes of the solar cell, the preparation cost of the electrodes and welding strips can be reduced, and the photoelectric conversion efficiency of the solar cells can be improved.

However, in conventional technologies, during connection between the welding strips and the electrodes, alloying between the welding strips and the electrodes needs to be formed through welding. Generally, the conventional welding strip includes solder layers, a melting point temperature of the solder layer in the solder strip is 183° C. During actual welding, a welding temperature is higher than the melting point temperature of solder by more than 20° C. Therefore, there is a relatively high welding temperature for alloying between the welding strips and the electrodes, and the relatively high welding temperature leads to greater warpage and deformation of the solar cell during the welding, which leads to a high risk of cracking and a high fragment rate of the solar cells after welding, thereby resulting in an increase in the repair rate and a decrease in the yield of the modules. To reduce welding damage, low-temperature welding strip can be adopted. The low-temperature welding strip generally forms a connection with the electrodes during lamination. However, during the lamination, due to the increase of the temperature, an adhesive film above the welding strip may change into a flowable state, and the flowable adhesive film may easily flow between the welding strips and the electrodes before formation of alloying between the welding strips and the electrodes, resulting in poor contact between the welding strips and the electrodes, thereby affecting the efficiency and yield of photovoltaic modules.

To solve above problems, embodiments of the disclosure provide a photovoltaic module and a method for manufacturing the photovoltaic module. In the photovoltaic module, a grid line (electrode) may be a secondary grid line (finger electrode) on a surface of a solar cell, and a connection member may be a welding strip replacing a main bus bar (MBB) arranged on the surface of the solar cell and used for connecting adjacent solar cells. Since the connection member replaces the MBB, a relatively thick MBB may not be disposed, such that the cost of the photovoltaic module can be reduced. In addition, relatively large shielding of the MBB on the surface of the solar cell can be avoided, which is beneficial to improving the photoelectric conversion efficiency of the solar cell and further improving the efficiency of the photovoltaic module. At least one encapsulation layer is arranged on a surface of each of the plurality of connection members and a part of a surface of each of the plurality of solar cells that is not covered by the plurality of connection members and used for protecting the solar cells. Each encapsulation layer includes a first encapsulation sub-layer adjacent to the surface of the solar cell and the connection member, and a second encapsulation sub-layer away from the solar cell. Flowability of the first encapsulation sub-layer is smaller than flowability of the second encapsulation sub-layer. The flowability of the first encapsulation sub-layer and the flowability of the second encapsulation sub-layer both refer to flowability at a lamination temperature. That is, the photovoltaic module is a photovoltaic module in a lamination process. The lamination process refers to a process of laying connection members on two opposite surfaces of each solar cell and performing lamination on the solar cells, the connection members, and at least one encapsulation layer at a certain lamination temperature after arranging the encapsulation layer on the connection members and a part of a surface of each solar cell exposed (not covered) by the connection members. At the lamination temperature, when the encapsulation layer is in a scorch stage, the encapsulation layer is flowable, and to avoid the encapsulation layer in the scorch stage to flow into the connection members and electrodes before alloying between the connection members and electrodes, resulting in poor contact between the connection members and electrodes, the first encapsulation sub-layer adjacent to the connection member and the solar cell is set to have relatively less flowability, which is beneficial to preventing the first encapsulation sub-layer from flowing between the connection members and the electrodes, thereby avoiding poor contact between the connection members and the electrodes and improving the efficiency and yield of the photovoltaic module. In addition, the first encapsulation sub-layer is used to isolate the second encapsulation sub-layer with larger flowability, and the second encapsulation sub-layer with larger flowability ensures that the whole encapsulation layer has a relatively high crosslinking degree (i.e., large crosslinking density), thereby ensuring that the encapsulation layer can provide good packaging protection for the solar cells and improving bonding strength between the encapsulation layer and a cover plate, thus prolonging the service life of the photovoltaic module.

According to a first aspect of the disclosure, embodiments of the disclosure provide a photovoltaic module. The photovoltaic module includes a plurality of solar cells, a plurality of connection members, and at least one encapsulation layer. A respective solar cell of the plurality of solar cells has a front surface and a rear surface opposite to the front surface, and the front surface and the rear surface each includes a plurality of electrodes formed thereon. Each connection member of the plurality of connection members is configured to connect two adjacent solar cells of the plurality of solar cells and has a first end portion disposed over the front surface of a first solar cell of the two adjacent solar cells and a second end portion disposed over the rear surface of a second solar cell of the two adjacent solar cells, and the first end portion is in contact with the plurality of electrodes on the front surface of the first solar cell, and the second end portion is in contact with the plurality of electrodes on the rear surface of the second solar cell. Each encapsulation layer of the at least one encapsulation layer includes a first encapsulation sub-layer and a second encapsulation sub-layer, the first encapsulation sub-layer is adjacent to the plurality of connection members and portions of the plurality of solar cells not covered by the plurality of connection members, and the second encapsulation sub-layer is on a surface of the first encapsulation sub-layer facing away from the plurality of solar cells, where flowability of the first encapsulation sub-layer is smaller than flowability of the second encapsulation sub-layer.

In some embodiments, a ratio of a minimum torque (ML) value of the first encapsulation sub-layer to a ML value of the second encapsulation sub-layer ranges from 1.5 to 8.5.

In some embodiments, a ML value of the first encapsulation sub-layer is in a range of 0.4 dN·m to 0.85 dN·m, and a ML value of the second encapsulation sub-layer is in a range of 0.1 dN·m to 0.3 dN·m.

In some embodiments, the photovoltaic module further includes a plurality of glue dots, where each glue dot is disposed between a corresponding solar cell and a corresponding connection member and disposed on a part of a surface of the corresponding solar cell outside the plurality of electrodes.

In some embodiments, the first encapsulation sub-layer and the second encapsulation sub-layer are integrally formed.

In some embodiments, a ratio of a thickness of the first encapsulation sub-layer to a maximum thickness of each connection member of the plurality of connection members ranges from 0.4 to 1, in a direction perpendicular to the front surface of each solar cell.

In some embodiments, a ratio of a thickness of the first encapsulation sub-layer to a thickness of the second encapsulation sub-layer is in a range of 0.3 to 1.5, in a direction perpendicular to the front surface of each solar cell.

In some embodiments, the first encapsulation sub-layer and the second encapsulation sub-layer include a same material.

According to a second aspect of the disclosure, a method for manufacturing the photovoltaic module is provided. The method is used for manufacturing the photovoltaic module described in the first aspect and includes the following. The plurality of solar cells are provided. A respective solar cell of the plurality of solar cells has a front surface and a rear surface opposite to the front surface, and the front surface and the rear surface each includes a plurality of electrodes formed thereon. The plurality of connection members are disposed by disposing the first end portion of each connection member over the front surface of the first solar cell of the two adjacent solar cells and disposing the second end portion of the each connection member over the rear surface of the second solar cell of the two adjacent solar cells. At least one encapsulation layer is disposed by disposing the first encapsulation sub-layer of each encapsulation layer adjacent to the plurality of connection members and portions of the plurality of solar cells not covered by the plurality of connection members and disposing the second encapsulation sub-layer on a surface of the first encapsulation sub-layer facing away from the plurality of solar cells. A lamination treatment is performed on the plurality of solar cells, the plurality of connection members, and the at least one encapsulation layer at a preset temperature, to enable the plurality of solar cells to be fixed with the at least one encapsulation layer. Flowability of the first encapsulation sub-layer at the preset temperature is smaller than flowability of the second encapsulation sub-layer at the preset temperature.

In some embodiments, the method further includes the following during disposing the plurality of connection members. A plurality of glue dots are formed, where each glue dot is disposed between a corresponding solar cell and a corresponding connection member and disposed on a part of a surface of the corresponding solar cell outside the electrodes.

Implementing the technical solutions of the disclosure has following advantageous effects. The grid line (electrode) may be a secondary grid line (finger electrode) on a surface of a solar cell, and the connection member may be a welding strip replacing a main bus bar (MBB) arranged on the surface of the solar cell and used for connecting adjacent solar cells. Since the connection member replaces the MBB, a relatively thick MBB may not be arranged, such that the cost of the photovoltaic module can be reduced. In addition, relatively large shielding of the MBB on the surface of the solar cell can be avoided, which is beneficial to improving the photoelectric conversion efficiency of the solar cell and further improving the efficiency of the photovoltaic module. The at least one encapsulation layer is arranged on a surface of each of the plurality of connection members and a part of a surface of each of the plurality of solar cells that is not covered by the plurality of connection members and used for protecting the solar cells. Each encapsulation layer includes a first encapsulation sub-layer adjacent to the surface of the solar cell and the connection member, and a second encapsulation sub-layer away from the solar cell. Flowability of the first encapsulation sub-layer is smaller than flowability of the second encapsulation sub-layer. The flowability of the first encapsulation sub-layer and the flowability of the second encapsulation sub-layer both refer to flowability at a lamination temperature. That is, the photovoltaic module is a photovoltaic module in a lamination process. The lamination process refers to a process of laying connection members on the two opposite surfaces of each solar cell and performing lamination on the solar cells, the connection members, and the at least one encapsulation layer at a certain lamination temperature after arranging the encapsulation layer on the connection members and a part of a surface of each solar cell exposed (not covered) by the connection members. At the lamination temperature, the connection member is alloyed with the electrodes located below the connection member, thereby forming contact connection. At the lamination temperature, when the encapsulation layer is in a scorch stage, the encapsulation layer is flowable, and to avoid the encapsulation layer in the scorch stage to flow into the connection members and electrodes before alloying between the connection members and electrodes, resulting in poor contact between the connection members and electrodes, the first encapsulation sub-layer adjacent to the connection member and the solar cell is set to have relatively less flowability, so that the first encapsulation sub-layer is prevented from flowing between the connection members and the electrodes, and thus avoiding poor contact between the connection members and the electrodes, such that the efficiency and yield of the photovoltaic module can be improved. In addition, the first encapsulation sub-layer is used to isolate the second encapsulation sub-layer with relatively large flowability, and the second encapsulation sub-layer with relatively large flowability is used to ensure that the whole encapsulation layer has a relatively high cross-linking degree, thereby ensuring that the encapsulation layer has good encapsulation protection for solar cells and improving the bonding strength between the encapsulation layer and the cover plate, thus facilitating the prolongation of the service life of photovoltaic modules.

According to a third aspect of the disclosure, embodiments of the disclosure provide a photovoltaic module. The photovoltaic module includes a plurality of solar cells, a plurality of connection members, and at least one encapsulation layer. A respective solar cell of the plurality of solar cells has a front surface and a rear surface opposite to the front surface, and the front surface and the rear surface each includes a plurality of electrodes formed thereon. Each connection member of the plurality of connection members is configured to connect two adjacent solar cells of the plurality of solar cells and has a first end portion disposed over the front surface of a first solar cell of the two adjacent solar cells and a second end portion disposed over the rear surface of a second solar cell of the two adjacent solar cells, and the first end portion is in contact with the plurality of electrodes on the front surface of the first solar cell, and the second end portion is in contact with the plurality of electrodes on the rear surface of the second solar cell. Each encapsulation layer includes a first encapsulation sub-layer, a second encapsulation sub-layer, and a third encapsulation sub-layer, the first encapsulation sub-layer is adjacent to the plurality of connection members and portions of the plurality of solar cells not covered by the plurality of connection members, the second encapsulation sub-layer is on a surface of the first encapsulation sub-layer facing away from the plurality of solar cells, and the third encapsulation sub-layer is disposed on a surface of the second encapsulation sub-layer away from the plurality of solar cells. Flowability of the third encapsulation sub-layer, the flowability of the second encapsulation sub-layer, and the flowability of the first encapsulation sub-layer are gradually reduced.

In some embodiments, a ratio of a ML value of the first encapsulation sub-layer to a ML value of the second encapsulation sub-layer is in a range of 1.1 to 3.

In some embodiments, a ratio of the ML value of the second encapsulation sub-layer to the ML value of the third encapsulation sub-layer is in a range of 1.1 to 4.

In some embodiments, a ML value of the first encapsulation sub-layer is in a range of 0.4 dN·m to 0.85 dN·m, and/or a ML value of the second encapsulation sub-layer is in a range of 0.3 dN·m to 0.4 dN·m.

In some embodiments, a ML value of the third encapsulation sub-layer is in a range of 0.1 dN·m to 0.3 dN·m.

In some embodiments, the photovoltaic module further includes a plurality of glue dots, where each glue dot is disposed between a corresponding solar cell and a corresponding connection member and disposed on a part of a surface of the corresponding solar cell outside the plurality of electrodes.

In some embodiments, the first encapsulation sub-layer, the second encapsulation sub-layer, and the third encapsulation sub-layer are integrally formed.

In some embodiments, a ratio of a thickness of the first encapsulation sub-layer to a maximum thickness of each connection member of the plurality of connection members ranges from 0.4 to 1, in a direction perpendicular to the front surface of each solar cell.

In some embodiments, a ratio of a thickness of the first encapsulation sub-layer to a thickness of the second encapsulation sub-layer is in a range of 1 to 4 in a direction perpendicular to the front surface of each solar cell.

In some embodiments, a ratio of a thickness of the second encapsulation sub-layer to a thickness of the third encapsulation sub-layer ranges from 0.2 to 0.7 in a direction perpendicular to the front surface of each solar cell.

In some embodiments, the first encapsulation sub-layer, the second encapsulation sub-layer, and the third encapsulation sub-layer include a same material.

According to a fourth aspect of the disclosure, a method for manufacturing the photovoltaic module is provided. The method is used for manufacturing the photovoltaic module described in the third aspect and includes the following. The plurality of solar cells are provided. A respective solar cell of the plurality of solar cells has a front surface and a rear surface opposite to the front surface, and the front surface and the rear surface each include a plurality of electrodes formed thereon. The plurality of connection members are disposed by disposing the first end portion of each connection member over the front surface of the first solar cell of the two adjacent solar cells and disposing the second end portion of the each connection member over the rear surface of the second solar cell of the two adjacent solar cells. At least one encapsulation layer is disposed by disposing the first encapsulation sub-layer of each encapsulation layer adjacent to the plurality of connection members and portions of the plurality of solar cells not covered by the plurality of connection members, disposing the second encapsulation sub-layer on a surface of the first encapsulation sub-layer facing away from the plurality of solar cells, and disposing the third encapsulation sub-layer on a surface of the second encapsulation sub-layer away from the plurality of solar cells. A lamination treatment is performed on the plurality of solar cells, the plurality of connection members, and the at least one encapsulation layer at a preset temperature, to enable the plurality of solar cells to be fixed with the at least one encapsulation layer. Flowability of the third encapsulation sub-layer, the flowability of the second encapsulation sub-layer, and the flowability of the first encapsulation sub-layer are gradually reduced at the preset temperature.

In some embodiments, the method further includes the following during disposing the plurality of connection members. A plurality of glue dots are formed, where each glue dot is disposed between a corresponding solar cell and a corresponding connection member and disposed on a part of a surface of the corresponding solar cell outside the electrodes.

Implementing the technical solutions of the disclosure has following advantageous effects. The grid line (electrode) may be a secondary grid line (finger electrode) on a surface of a solar cell, and the connection member may be a welding strip replacing a main bus bar (MBB) arranged on the surface of the solar cell and used for connecting adjacent solar cells. Since the connection member replaces the MBB, a relatively thick MBB may not be arranged, such that the cost of the photovoltaic module can be reduced. In addition, relatively large shielding of the MBB on the surface of the solar cell can be avoided, which is beneficial to improving the photoelectric conversion efficiency of the solar cell and further improving the efficiency of the photovoltaic module. The at least one encapsulation layer is arranged on a surface of each of the plurality of connection members and a part of a surface of each of the plurality of solar cells that is not covered by the plurality of connection members and used for protecting the solar cells. Each encapsulation layer includes a first encapsulation sub-layer, a second encapsulation sub-layer, and a third encapsulation sub-layer that are sequentially arranged in a direction away from the plurality of solar cells. Flowability of the third encapsulation sub-layer, the flowability of the second encapsulation sub-layer, and the flowability of the first encapsulation sub-layer are gradually reduced. The flowability of the first encapsulation sub-layer, the flowability of the second encapsulation sub-layer, and the flowability of the first encapsulation sub-layer refer to flowability at a lamination temperature. That is, the photovoltaic module is a photovoltaic module in a lamination process. The lamination process refers to a process of laying connection members on the two opposite surfaces of each solar cell and performing lamination on the solar cells, the connection members, and the at least one encapsulation layer at a certain lamination temperature after arranging the encapsulation layer on the connection members and a part of a surface of each solar cell exposed (not covered) by the connection members. At the lamination temperature, the connection member is alloyed with the electrodes located below the connection member, thereby forming contact connection. At the lamination temperature, when the encapsulation layer is in a scorch stage, the encapsulation layer is flowable, and to avoid the encapsulation layer in the scorch stage to flow into the connection members and electrodes before alloying between the connection members and electrodes, resulting in poor contact between the connection members and electrodes, the first encapsulation sub-layer adjacent to the connection member and the solar cell is set to have relatively less flowability, so that the first encapsulation sub-layer is prevented from flowing between the connection members and the electrodes, and thus avoiding poor contact between the connection members and the electrodes, such that the efficiency and yield of the photovoltaic module can be improved. In addition, the first encapsulation sub-layer is used to isolate the second encapsulation sub-layer and the third encapsulation sub-layer that have relatively large flowability, and the second encapsulation sub-layer is used as a good connection bridge between the first encapsulation sub-layer and the third encapsulation sub-layer, such that the bonding strength between the first encapsulation sub-layer and the third encapsulation sub-layer can be improved. Furthermore, the third encapsulation sub-layer with the largest flowability is beneficial to ensuring the strong bonding strength between the encapsulation layer and the cover plate, thus prolonging the service life of the photovoltaic module.

Various embodiments of the disclosure may be described in detail below with reference to the accompanying drawings. However, those of ordinary skill in the art should appreciate that many technical details have been proposed in various embodiments of the disclosure for better understanding of the disclosure. The technical solutions in the disclosure can be realized even without these technical details as well as various changes and modifications based on the following embodiments.

Figure 2:
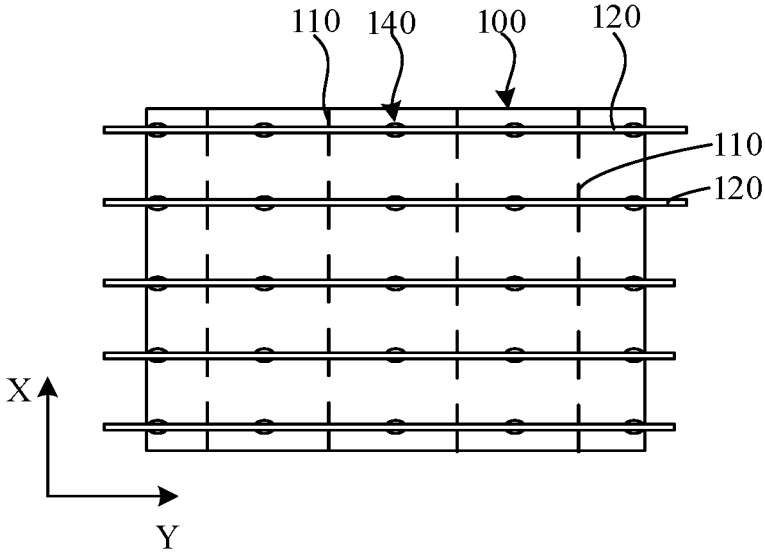
FIG. 2 is a schematic structural view of electrodes and connection members on a surface of a solar cell according to an embodiment of the disclosure.

FIG. 1A is a schematic cross-sectional structural view of a photovoltaic module according to an embodiment of the disclosure. FIG. 2 is a schematic structural view of electrodes and connection members on a surface of a solar cell according to an embodiment of the disclosure.

As illustrated in FIG. 1A and FIG. 2, the photovoltaic module includes a plurality of solar cells 100 and a plurality of connection members 120. Each solar cell 100 includes a plurality of electrodes 110 on each surface of two opposite surfaces of the solar cell 100. The plurality of connection members 120 are located on a surface of the plurality of solar cells 100 and each connection member connects adjacent solar cells 100. A respective connection member 120 located on each electrode 110 is in contact with the electrode 110 (each connection member 120 has a first end portion 1201 disposed over the front surface of a first solar cell of the two adjacent solar cells 100 and a second end portion 1202 disposed over the rear surface of a second solar cell of the two adjacent solar cells 100, and the first end portion 1201 is in contact with the plurality of electrodes 110 on the front surface of the first solar cell, and the second end portion 1202 is in contact with the plurality of electrodes 110 on the rear surface of the second solar cell).

The solar cell 100 can absorb photons in the incident light and generate electron-hole pairs. The electron-hole pairs are separated by a built-in electric field in the solar cell 100 and generates electric potential at both ends of a PN junction, thereby converting light energy into electric energy. In some embodiments, one surface of the solar cell 100 serves as a light-receiving surface for absorbing incident light. In other embodiments, both surfaces of the solar cell 100 serve as light-receiving surfaces for absorbing incident light. In some embodiments, the solar cell 100 may be a crystalline silicon solar cell, such as, a monocrystalline silicon solar cell or a polysilicon solar cell. It shall be understood that in some embodiments, each photovoltaic module may include multiple solar cells 100. When the photovoltaic module includes multiple solar cells 100, a plurality of cell strings may be formed by electrically connecting in the form of a whole piece or a plurality of slice cells (e.g., ½-split cell, ⅓-split cell, ¼-split cell, etc.). The plurality of cell strings are electrically connected in series and/or in parallel.

The solar cell 100 may include, but is not limited to, any one of a passivated emitter and rear cell (PERC) cell, a passivated emitter and rear totally-diffused (PERT) cell, a tunnel oxide passivated contact (TOPCon) cell, and a heterojunction technology (HIT/HJT) cell.

The solar cell 100 may include a substrate. The substrate may be a silicon substrate. In some embodiments, the solar cell 100 has a front surface 101 and a rear surface 102 opposite to the front surface 101. Each of the front surface 101 and the rear surface 102 may be printed with a metal paste to form electrodes 110 having a particular pattern.

In some embodiments, the plurality of solar cells 100 in the photovoltaic module are arranged at intervals and arranged in parallel. The connection member 120 connects opposite surfaces of two adjacent solar cells 100 to form electrical connection between the two adjacent solar cells 100. For example, as illustrated in FIG. 1A, a first end portion 1201 of each connection member 120 is disposed on the front surface of one of two respective adjacent solar cells 100, and a second end portion 1202 of the each connection member 120 is disposed on the rear surface of the other of the two respective adjacent solar cells 100.

In some embodiments, the connection member 120 may be a welding strip. The connection member 120 may have a circular shape, a rectangular shape, a trapezoidal shape, or a triangular shape in a cross section perpendicular to an extension direction of the connection member 120.

In some embodiments, the electrode 110 may be a finger electrode on the surface of the solar cell 100 and used for collecting and deriving electrons generated by the photovoltaic effect. The connection member 120 may be a welding strip that replaces a main bus bas (MBB) arranged on the surface of the solar cell 100 and used for connecting adjacent solar cells 100. By replacing the MBB with the connection member 120, it is possible to arrange a thicker MBB, such that the cost of photovoltaic modules can be reduced. In addition, it is also possible to avoid relatively large shielding of the MBB on the surface of the solar cell 100, which is beneficial to improving the photoelectric conversion efficiency of the solar cell 100 and further improving the efficiency of the photovoltaic module.

In some embodiments, referring to FIG. 2, the electrode 110 may be a finger electrode on the surface of the solar cell 100, and the connection member 120 may be a welding strip that replaces a MBB arranged on the surface of the solar cell 100 and used for connecting adjacent solar cells 100. Each of the plurality of electrodes 110 on the surface of the solar cell extends along a first direction X and the plurality of electrodes 110 are spaced apart from each other in a second direction Y. At least two connection members 120 on the surface of the solar cell each extend along the second direction Y and are spaced apart from each other in the first direction X. The first direction X intersects the second direction Y.

In some embodiments, the plurality of electrodes 110 may also be MBBs and finger electrodes. The finger electrodes are used to guide current, and the MBB are used to collect the current on the finger electrodes for performing current collection. The connection member 120 is a welding strip connected to the MBBs.

It is to be noted that the connection member 120 in embodiments of the present disclosure is a low-temperature welding strip. The low-temperature welding strip is connected with the electrodes 110 in the lamination process, so that a relatively high welding temperature caused by adopting a high-temperature welding strip is avoided, and then the damage caused by the high welding temperature to the solar cell 100 is avoided, which is beneficial to reducing the repair rate of the photovoltaic module and improving the finished product rate of the photovoltaic module.

In some embodiments, the connection member 120 is a tin-coated metal welding strip, and a melting temperature of the tin layer is not higher than 150° C., generally in a range of 130° ° C. to 150° C., which is beneficial to adapt to the lamination temperature of the photovoltaic module.

Referring to FIG. 1A, the photovoltaic module further includes at least one encapsulation layer 130. The at least one encapsulation layer 130 is arranged on a surface of each of the plurality of connection members 120 and a part of a surface of each of the plurality of solar cells 100 that is not covered by the plurality of connection members 120. Each encapsulation layer 130 includes at least a first encapsulation sub-layer 131 and a second encapsulation sub-layer 132 that are sequentially arranged in a direction away from a surface of each of the plurality of solar cells 100. Flowability of the first encapsulation sub-layer 131 is smaller than that of the second encapsulation sub-layer 132. The encapsulation layer 130 is used for encapsulating and protecting the solar cells. The encapsulation layer may be an adhesive film.

In some embodiments, the at least one encapsulation layer 130 is provided on both the front surface 101 and the rear surface 102 of each solar cell 100, and covers the connection members 120 on the surface of each solar cell 100. The at least one encapsulation layer 130 is used for encapsulation of the solar cells 100, and achieving bonding between the solar cells 100 and at least one cover plate (not shown).

It shall be noted that the flowability of the first encapsulation sub-layer 131 and the flowability of the second encapsulation sub-layer 132 are both flowability at a lamination temperature. That is, the photovoltaic module is a photovoltaic module in the lamination process, and the lamination process involves a process of laying connection members 120 on two opposite surfaces of each solar cell 100, and performing lamination on the solar cells 100, the connection members 120, and the at least one encapsulation layer 130 at a certain lamination temperature after arranging the encapsulation layer 130 on the connection members 120 and a part of a surface of the solar cell exposed (not covered) by the connection members 120. At the lamination temperature, the connection member 120 is alloyed with the electrode 110 located below the connection member 120, thereby forming a contact connection. At the lamination temperature, when the encapsulation layer is in a scorch stage, the encapsulation layer is flowable, and the first encapsulation sub-layer 131 adjacent to the connection member 120 and the solar cell 100 is set to have relatively less flowability, so that the first encapsulation sub-layer 131 is prevented from flowing between the connection members 120 and the electrodes 110, and thus avoiding poor contact between the connection members 120 and the electrodes 110, such that the efficiency and yield of the photovoltaic module can be improved. In addition, the first encapsulation sub-layer 131 is used to isolate the second encapsulation sub-layer 132 with relatively large flowability, and the second encapsulation sub-layer 132 with relatively large flowability is used to ensure that the whole encapsulation layer 130 has a relatively high cross-linking degree, thereby ensuring that the encapsulation layer 130 has good encapsulation protection for solar cells and improving the bonding strength between the encapsulation layer 130 and the cover plate, thus facilitating the prolongation of the service life of photovoltaic modules.

The flowability of the first encapsulation sub-layer 131 can be expressed by a minimum torque (ML) value of the first encapsulation sub-layer 131, and the flowability of the second encapsulation sub-layer 132 can be expressed by a ML value of the second encapsulation sub-layer 132. The ML value represents a minimum torque in a vulcanization curve of an adhesive film. The lower the ML value, the greater the flowability of the adhesive film before a crosslinking reaction of the adhesive film in the lamination process. The higher the ML value, the lower the flowability of the adhesive film before the cross-linking reaction of the adhesive film in the lamination process.

It shall be noted that the vulcanization curve is used to characterize the vulcanization performance of the adhesive film, and the vulcanization performance is a performance of the adhesive film in the vulcanization process. In the vulcanization process, the adhesive film may undergo vulcanization reaction, and the vulcanization reaction (cross-linking reaction) refers to a process that the molecular chain of the adhesive film undergoes a chemical cross-linking reaction under the action of chemical or physical factors, forming a spatial network structure. The linear macromolecules of the unvulcanized adhesive film are curled and in a free motion state. When being subjected to external force, linear macromolecules are prone to displacement, that is, there is a large plastic flow. In the vulcanized adhesive film, the soft linear macromolecules become spatial network structure through cross-linking, so the relative movement of linear macromolecules is limited to some extent. Under the action of external force, the linear macromolecules are not easy to have large displacement, but have higher stress and strength, and the physical and mechanical properties and chemical properties of the adhesive film are improved through vulcanization.

Generally, a change of the vulcanization performance of the adhesive film in the vulcanization process can be measured by vulcanization tester. The principle of vulcanization tester is that: the adhesive film sample located in a mold cavity is pressed and molded to make the adhesive film sample continuously bear sinusoidal shear deformation with constant, small amplitude, and low frequency, a shear stress is measured by a force sensor of the vulcanization tester, and the shear stress is expressed in the unit of torque. The curve of recorded shear stress-time is the vulcanization curve.

Figure 3:
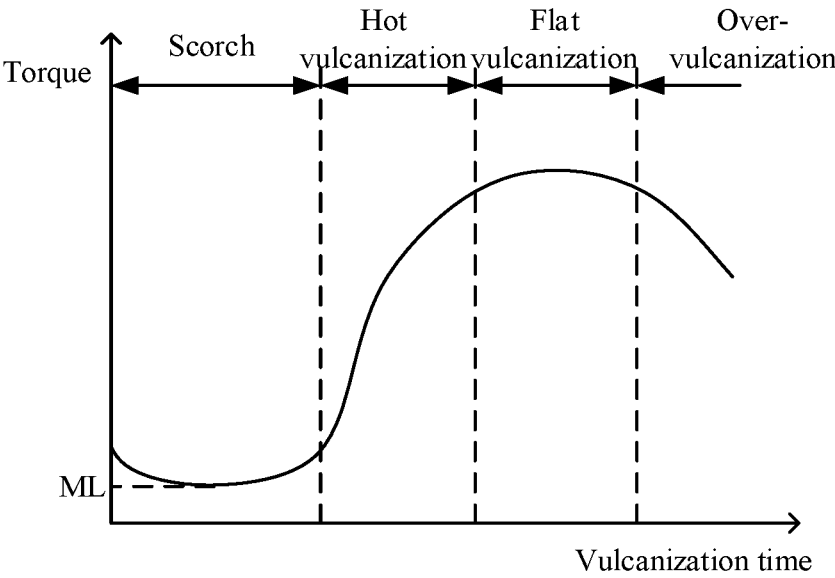
FIG. 3 is a schematic diagram of a vulcanization curve according to an embodiment of the disclosure.

FIG. 3 is a schematic diagram of a vulcanization curve according to an embodiment of the disclosure. Referring to FIG. 3, the vulcanization process of the adhesive film includes four stages: a scorch stage, a hot vulcanization stage, a flat vulcanization stage, and an over-vulcanization stage. The scorch stage is equivalent to an induction period in the vulcanization reaction. In the scorch stage, the cross-linking reaction has not yet started, the adhesive film has flowability, and the adhesive film samples produce cross-linkable free radicals. The hot vulcanization stage is the vulcanization reaction (cross-linking reaction) stage, the adhesive film molecules gradually form a network structure, and the elasticity and strength of the adhesive film rise sharply. In the flat vulcanization stage, the adhesive film has reached the proper degree of cross linking, and during this period, the physical and mechanical properties of the adhesive film reach or approach a best physical and mechanical performance, or achieve the best comprehensive balance. In the over-vulcanization stage, the cross-linking bonds in the adhesive film were rearranged and the cross-linking bonds and molecular chains in the adhesive film were pyrolyzed, such that the performance of the adhesive film is degraded.

Referring to FIG. 3, the ML value represents a minimum shear stress value before the start of the cross-linking reaction of the adhesive film, i.e., a maximum value of the flowability of the adhesive film before the flat vulcanization stage (the start of the cross-linking reaction) in the vulcanization process.

Figure 1B:
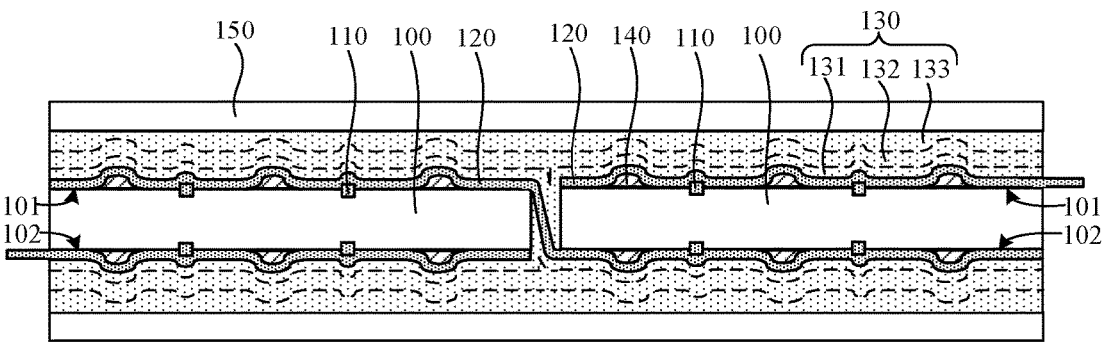
FIG. 1B is a schematic cross-sectional structural view of a photovoltaic module according to another embodiment of the disclosure.

In some embodiments, referring to FIG. 1B, the encapsulation layer may also include a first encapsulation sub-layer 131, a second encapsulation sub-layer 132, and a third encapsulation sub-layer 133 sequentially arranged in a direction away from the solar cell. Flowability (which may be represented by an ML value) of the third encapsulation sub-layer 133, the flowability of the second encapsulation sub-layer 132, and the flowability of the first encapsulation sub-layer 131 are sequentially decreased.

In this case, the first encapsulation sub-layer 131 is used to isolate the second encapsulation sub-layer 132 and the third encapsulation sub-layer 133 which have relatively large flowability, the second encapsulation sub-layer 132 is used as a bridge between the first encapsulation sub-layer 131 and the third encapsulation sub-layer 133, such that the bonding strength between the first encapsulation sub-layer 131 and the third encapsulation sub-layer 133 can be increased. The third encapsulation sub-layer 133 with the greatest flowability is beneficial to ensure the strong bonding strength between the encapsulation layer 130 and the cover plate, thus prolonging the service life of photovoltaic module.

In some embodiments, the encapsulation layer may also include a first encapsulation sub-layer, a second encapsulation sub-layer, a third encapsulation sub-layer, and a fourth encapsulation sub-layer sequentially arranged in the direction away from the solar cell. Flowability of the fourth encapsulation sub-layer, the flowability of the third encapsulation sub-layer, the flowability of the second encapsulation sub-layer, and the flowability of the first encapsulation sub-layer are sequentially reduced. Embodiments of the present disclosure do not specifically limit the number of stacks having different flowability in the encapsulation layer, as long as the flowability of a plurality of stacks on the surface of the solar cell is ensured to increase sequentially in a direction away from the solar cell.

In some embodiments, referring to FIG. 1A, the first encapsulation sub-layer 131 before lamination is a pre-crosslinked adhesive film, and the second encapsulation sub-layer 132 before lamination is a non-pre-crosslinked adhesive film. The difference between the pre-crosslinked adhesive film and the non-pre-crosslinked adhesive film is that: whether a cross-linking reaction occurs between internal molecules of materials in the adhesive film before lamination. The cross-linking reaction refers to that two or more molecules (generally linear molecules) are bonded and crosslinked with each other to form a relatively stable molecule (body molecule) with network structure. Generally, during lamination, after a certain lamination time at a certain lamination temperature, the adhesive film presents a state of great flowability (scorch stage), and the crosslinking agent in the adhesive film decomposes to produce free radicals. As time goes on, free radicals initiate the bonding between long chain molecules in the adhesive film, so that the adhesive film, the solar cells, and the cover plate are bonded and fixed together. Before lamination, some molecules in the pre-crosslinked adhesive film have already had cross-linking reaction, so the flowability of the pre-crosslinked adhesive film in the scorch stage is smaller than that of the non-pre-crosslinked adhesive film in the scorch stage. The flowability of the pre-crosslinked adhesive film in the scorch stage depends on a proportion of the molecules that have already had cross-linking reaction in the pre-crosslinked adhesive film before lamination.

In other embodiments, referring to FIG. 1B, the first encapsulation sub-layer 131 before lamination is a pre-crosslinked adhesive film, the second encapsulation sub-layer 132 before lamination is a pre-crosslinked adhesive film, and the third encapsulation sub-layer 133 before lamination is a non-pre-crosslinked adhesive film.

Referring to FIG. 1A, in some embodiments, the first encapsulation sub-layer 131 and/or the second encapsulation sub-layer 132 may be a polyethylene octene co-elastomer (POE) adhesive film. The POE adhesive film is composed of saturated fatty chains and has excellent ultraviolet aging resistance, excellent heat resistance and low temperature resistance. The POE adhesive film has the characteristics of wide application temperature range, good light transmittance, excellent electrical insulation performance, low cost, and easy for fabrication. In other embodiments, the first encapsulation sub-layer 131 and/or the second encapsulation sub-layer 132 may also be an ethylene-vinyl acetate copolymer (EVA) adhesive film, and the EVA adhesive film is a more common adhesive film. The main component of the EVA adhesive film is EVA, and the EVA adhesive film may further include a small amount of crosslinking agent, co-crosslinking agent, anti-aging agent, and other functional aids.

Referring to FIG. 1B, in some embodiments, at least one of the first encapsulation sub-layer 131, the second encapsulation sub-layer 132, and the third encapsulation sub-layer 133 may be a POE adhesive film. In other embodiments, at least one of the first encapsulation sub-layer 131, the second encapsulation sub-layer 132, and the third encapsulation sub-layer 133 may be an EVA adhesive film.

In some embodiments, at least both of the first encapsulation sub-layer 131, the second encapsulation sub-layer 132, and the third encapsulation sub-layer 133 include a same material.

For example, the material of the first encapsulation sub-layer 131 is the same as that of the second encapsulation sub-layer 132. Since the first encapsulation sub-layer 131 and the second encapsulation sub-layer 132 includes the same material, the molecules of the first encapsulation sub-layer 131 and the molecules of the second encapsulation sub-layer 132 may have higher bonding strength, such that the bonding strength between the first encapsulation sub-layer 131 and the second encapsulation sub-layer 132 after lamination can be improved. Alternatively, the material of the first encapsulation sub-layer 131, the material of the second encapsulation sub-layer 132, and the material of the third encapsulation sub-layer 133 are all the same. When the first encapsulation sub-layer 131, the second encapsulation sub-layer 132, and the third encapsulation sub-layer 133 includes the same material, the molecules of the first encapsulation sub-layer 131 and the molecules of the second encapsulation sub-layer 132 may have higher bonding strength, and the molecules of the second encapsulation sub-layer 132 and the molecules of the third encapsulation sub-layer 133 may have higher bonding strength, thereby facilitating improving the bonding strength between the first encapsulation sub-layer 131 and the second encapsulation sub-layer 132 after lamination and improving the bonding strength between the second encapsulation sub-layer 132 and the third encapsulation sub-layer 133 after lamination.

In some embodiments, referring to FIG. 1A, the first encapsulation sub-layer 131 and the second encapsulation sub-layer 132 are integrally formed. Compared with laminating the first encapsulation sub-layer 131 and the second encapsulation sub-layer 132 that are individually formed, when the integrally formed first encapsulation sub-layer 131 and the second encapsulation sub-layer 132 are directly used as the encapsulation layer 130, higher adhesion and fixing strength between the first encapsulation sub-layer 131 and the second encapsulation sub-layer 132 can be ensured, thereby further improving the structural stability of photovoltaic modules.

In some embodiments, referring to FIG. 1B, the first encapsulation sub-layer 131, the second encapsulation sub-layer 132, and the third encapsulation sub-layer 133 are integrally formed. Compared with laminating the first encapsulation sub-layer 131, the second encapsulation sub-layer 132, and the third encapsulation sub-layer 133 which are individually formed, when the integrally formed first encapsulation sub-layer 131, the second encapsulation sub-layer 132, and the third encapsulation sub-layer 133 are directly used as the encapsulation layer 130, higher adhesion and fixing strength between the first encapsulation sub-layer 131 and the second encapsulation sub-layer 132, and higher adhesion and fixing strength between the second encapsulation sub-layer 132 and the third encapsulation sub-layer 133 can be ensured, thereby improving the structural stability of photovoltaic modules.

In some embodiments, referring to FIG. 1A, the material of the first encapsulation sub-layer 131 is the same as the material of the second encapsulation sub-layer 132, and the first encapsulation sub-layer 131 and the second encapsulation sub-layer 132 are integrally formed. In some embodiments, the encapsulation layer 130 may be formed as follows. An initial encapsulation layer is obtained, where the initial encapsulation layer can be a non-pre-crosslinked adhesive film, and the initial encapsulation layer includes a first portion and a second portion that are stacked. A pre-crosslinking treatment is performed on a side of the first portion away from the second portion in the initial encapsulation layer, so that some molecules in the first portion of the initial encapsulation layer undergo cross-linking reaction to form the pre-crosslinked first encapsulation sub-layer 131 with less flowability. The second portion of the initial encapsulation layer is still a non-pre-crosslinked adhesive film, and thus second portion of the initial encapsulation layer can be taken as the second encapsulation sub-layer 132 with higher flowability, which is beneficial to reducing the difficulty of obtaining the encapsulation layer 130. The pre-crosslinking treatment can be crosslinking treatment such as electron beam irradiation or ultraviolet irradiation.

In some embodiments, referring to FIG. 1B, the first encapsulation sub-layer 131, the second encapsulation sub-layer 132, and the third encapsulation sub-layer 133 include same materials, and the first encapsulation sub-layer 131, the second encapsulation sub-layer 132, and the third encapsulation sub-layer 133 are integrally formed. In some embodiments, the encapsulation layer 130 may be formed as follows. An initial encapsulation layer is obtained. The initial encapsulation layer can be a non-pre-crosslinked adhesive film, and the initial encapsulation layer includes a first portion, a second portion, and a third portion stacked. A pre-crosslinking treatment is performed on a side of the first portion away from the third portion in the initial encapsulation layer, so that some molecules in the first portion of the initial encapsulation layer and some molecules in the second portion of the initial encapsulation layer undergo cross-linking reaction, and a proportion of molecules that have already had cross-linking reaction in the first portion of the initial encapsulation layer is higher than a proportion of molecules that have already had cross-linking reaction in the second portion of the initial encapsulation layer, to form the pre-crosslinked first encapsulation sub-layer 131 and the pre-crosslinked second encapsulation sub-layer 132 that have gradually increased flowability. The third portion of the initial encapsulation layer is still a non-pre-crosslinked adhesive film, and the third portion of the initial encapsulation layer is regarded as the third encapsulation sub-layer 133 having the highest flowability, thus facilitating reducing difficulty in obtaining the encapsulation layer 130. The pre-crosslinking treatment may be a crosslinking treatment such as electron beam irradiation or ultraviolet irradiation.

In some embodiments, referring to FIG. 1A, the encapsulation layer 130 may be formed as follows. An initial first encapsulation sub-layer and an initial second encapsulation sub-layer that are individually formed are obtained, where the initial first encapsulation sub-layer and the initial second encapsulation sub-layer are both non-pre-crosslinked adhesive films. A pre-crosslinking treatment is performed on the initial first encapsulation sub-layer so that some molecules in the initial first encapsulation sub-layer undergo cross-linking reaction, thereby forming a pre-crosslinked first encapsulation sub-layer 131 with less flowability. The initial second encapsulation sub-layer serves as a non-pre-crosslinked second encapsulation sub-layer 132 with greater flowability. The individual first encapsulation sub-layer 131 and the individual second encapsulation sub-layer 132 are fixed together to form the encapsulation layer 130. The pre-crosslinking treatment can be crosslinking treatment such as electron beam irradiation or ultraviolet irradiation.

In some embodiments, referring to FIG. 1B, the encapsulation layer 130 may also be formed as follows. An initial first encapsulation sub-layer, an initial second encapsulation sub-layer, and an initial third encapsulation sub-layer that are individually formed are obtained. The initial first encapsulation sub-layer, the initial second encapsulation sub-layer, and the initial third encapsulation sub-layer are all non-pre-crosslinked adhesive films. Different degrees of pre-crosslinking treatments are respectively performed on the initial first encapsulation sub-layer and the initial second encapsulation sub-layer, so that some molecules in the initial first encapsulation sub-layer and some molecules in the initial second encapsulation sub-layer undergo cross-linking reaction, and a proportion of molecules that have already had cross-linking reaction in the initial first encapsulation sub-layer is higher than the proportion of molecules that have already had cross-linking reaction in the initial second encapsulation sub-layer, so as to form the pre-crosslinked first encapsulation sub-layer 131 and the pre-crosslinked second encapsulation sub-layer 132 which have successively increased flowability. The initial third encapsulation sub-layer is used as a non-pre-crosslinked third encapsulation sub-layer 133 having higher flowability. The individual first encapsulation sub-layer 131, the individual second encapsulation sub-layer 132, and individual the third encapsulation sub-layer 133 are fixed together to form the encapsulation layer 130. The pre-crosslinking treatment may be a crosslinking treatment such as electron beam irradiation or ultraviolet irradiation.

In some embodiments, referring to FIG. 1A, a ratio of the ML value of the first encapsulation sub-layer to the ML value of the second encapsulation sub-layer 132 ranges from 1.5 to 8.5. If the ML value of the first encapsulation sub-layer 131 is defined as ML1 and the ML value of the second encapsulation sub-layer 132 is defined as ML2, the ratio of ML1 to ML2 ranges from 1.5 to 8.5. For example, the ratio of ML1 to ML2 is 1.5, 2, 4, 7, or 8.5. If the ratio of ML1 to ML2 is too small, the first encapsulation sub-layer 131 may be in a state of high flowability, and then the first encapsulation sub-layer 131 in the scorch stage may flow between the electrodes 110 and the connection members 120 before alloying between the electrodes 110 and the connection members 120, resulting in poor contact between the electrodes 110 and the connection members 120. If the ratio of ML1 to ML2 is too large, the flowability of the first encapsulation sub-layer 131 may be too small. That is, before lamination, the proportion of molecules that have already had cross-linking reaction in the first encapsulation sub-layer 131 may be too large, which may lead to poor adhesion and fixing ability of the first encapsulation sub-layer 131 in the photovoltaic module after lamination, resulting in the risk of separation between the solar cells 100 and the first encapsulation sub-layer 131 in the photovoltaic module. Therefore, by setting the ratio of ML1 to ML2 to be in a range of 1.5 to 8.5, it is possible to avoid poor contact between the electrodes 110 and the connection members 120, but also to ensure that the first encapsulation sub-layer 131 has a high bonding strength.

In some embodiments, referring to FIG. 1B, a ratio of the ML value of the first encapsulation sub-layer 131 to the ML value of the second encapsulation sub-layer ranges from 1.1 to 3. If the ML value of the first encapsulation sub-layer 131 is defined as ML1 and the ML value of the second encapsulation sub-layer 132 is defined as ML2, the ratio of ML1 to ML2 ranges from 1.1 to 3, for example, 1.5, 2, 2.5, 2.6, or 2.7. If the ratio of ML1 to ML2 is too small, the first encapsulation sub-layer 131 may be in a state of high flowability, and then the first encapsulation sub-layer 131 in the scorch stage may flow between the electrodes 110 and the connection members 120 before alloying between the electrodes 110 and the connection members 120, resulting in poor contact between the electrodes 110 and the connection members 120. If the ratio of ML1 to ML2 is too large, the flowability of the first encapsulation sub-layer 131 may be too small. That is, before lamination, the proportion of molecules that have already had cross-linking reaction in the first encapsulation sub-layer 131 may be too large, which may lead to poor adhesion and fixing ability of the first encapsulation sub-layer 131 in the laminated photovoltaic module, resulting in the risk of separation between the solar cell 100 and the first encapsulation sub-layer 131 in the photovoltaic module. Therefore, by setting the ratio of ML1 to ML2 to be in a range of 1.1 to 3, it is possible to avoid poor contact between the electrodes 110 and the connection members 120, but also to ensure that the first encapsulation sub-layer 131 has a high bonding strength.

In some embodiments, referring to FIG. 1B, a ratio of the ML value of the second encapsulation sub-layer 132 to the ML value of the third encapsulation sub-layer 133 ranges from 1.1 to 4. If the ML value of the second encapsulation sub-layer 132 is defined as ML2 and the ML value of the third encapsulation sub-layer 133 is defined as ML3, the ratio of ML2 to ML3 ranges from 1.1 to 4, for example, 1.5, 2, 2.5, 2.6, or 3.5. If the ratio of ML2 to ML3 is too small, the flowability of the second encapsulation sub-layer 132 is too close to that of the third encapsulation sub-layer 133, so that the second encapsulation sub-layer 132 may not serve as a good connection bridge between the first encapsulation sub-layer 131 and the third encapsulation sub-layer 133, that is, the bonding strength between the first encapsulation sub-layer 131 and the second encapsulation sub-layer 132 is reduced. If the ratio of ML2 to ML3 is too large, the flowability of the second encapsulation sub-layer 132 is too close to that of the first encapsulation sub-layer 131, so that the second encapsulation sub-layer 132 may not serve as a good connection bridge between the first encapsulation sub-layer 131 and the third encapsulation sub-layer 133, that is, the bonding strength between the third encapsulation sub-layer 133 and the second encapsulation sub-layer 132 is reduced. Therefore, by setting the ratio of ML2 to ML3 to be in a range of 1.1 to 4, it is possible to ensure a higher bonding strength between the first encapsulation sub-layer 131 and the second encapsulation sub-layer 132 and a higher bonding strength between the second encapsulation sub-layer 132 and the third encapsulation sub-layer 133.

In some embodiments, referring to FIGS. 1A and 1B, the ML value of the first encapsulation sub-layer 131 is in a range of 0.4 dN·m to 0.85 dN·m, for example, the ML value of the first encapsulation sub-layer 131 is 0.42 dN·m, 0.45 dN·m, 0.5 dN·m. 0.75 dN·m. 0.8 dN·m, etc. If the ML value of the first encapsulation sub-layer 131 is too small, the flowability of the first encapsulation sub-layer 131 is too large, and the first encapsulation sub-layer 131 in the scorch stage may flow between the electrodes 110 and the connection members 120 before alloying between the electrodes 110 and the connection members 120, resulting in poor contact between the electrodes 110 and the connection members 120. If the ML value of the first encapsulation sub-layer 131 is too large, the flowability of the first encapsulation sub-layer 131 is too small, that is, the proportion of molecules in the first encapsulation sub-layer 131 that have already had cross-linking reaction is too large before lamination, which may lead to poor adhesion and fixing ability of the first encapsulation sub-layer 131 in the photovoltaic module after lamination. Therefore, by setting the ML value (reflecting the flowability of the first encapsulation sub-layer 131) of the first encapsulation sub-layer 131 to be in a range of 0.4 dN·m to 0.85 dN·m, the flowability of the first encapsulation sub-layer 131 can be ensured within a reasonable range, which is beneficial not only to avoid the poor contact between the electrodes 110 and the connection members 120, but also to ensure that the first encapsulation sub-layer 131 has a high bonding strength.

In some embodiments, referring to FIG. 1A, the ML value of the second encapsulation sub-layer 132 is in a range of 0.1 dN·m to 0.3 dN·m, for example, the ML value of the second encapsulation sub-layer 132 is 0.12 dN·m. 0.15 dN·m, 0.2 dN·m, 0.25 dN·m, or 0.3 dN·m, or the like. If the flowability of the second encapsulation sub-layer 132 is too small, the adhesion and fixing ability of the second encapsulation sub-layer 132 in the photovoltaic module after lamination may be too poor. Therefore, by setting the ML value of the second encapsulation sub-layer 132 to be in a range of 0.1 dN·m to 0.3 dN·m, the second encapsulation sub-layer 132 can be ensured to have a higher bonding strength.

If the ML value of the first encapsulation sub-layer is defined as ML1 and the ML value of the second encapsulation sub-layer is defined as ML2, the influence of the ML values of the first encapsulation sub-layer and the ML values of the second encapsulation sub-layer on the connection state between the electrodes and the connection members after lamination is illustrated in following Table 1.

TABLE 1

| | Comparative examples | | Embodiments | | | Comparative examples | | Embodiments | | |
|---|---|---|---|---|---|---|---|---|---|---|
| | 1 | 2 | 1 | 2 | 3 | 3 | 4 | 4 | 5 | 6 |
| ML1 (dN · m) | 0.1 | 0.2 | 0.4 | 0.6 | 0.8 | 0.1 | 0.2 | 0.4 | 0.6 | 0.8 |
| ML2 (dN · m) | 0.1 | 0.1 | 0.1 | 0.1 | 0.1 | 0.2 | 0.2 | 0.2 | 0.2 | 0.2 |
| Percentage of samples in which the connection members form contact connection with the electrodes to the total number of samples | 50% | 60% | 96% | 98% | 100% | 52% | 62% | 96% | 98% | 100% |

The data sources in Table 1 above can be obtained as follows. Connection points between connection members and electrodes that are located in a same region of each solar cell in a plurality of comparative examples are sampled, and connection points between connection members and electrodes that are located in the same region of each solar cell in a plurality of embodiments are sampled. The total number of samples on each solar cell can be 50, and the number of samples in which the electrodes on the solar cell forms contact connection with the connection members, Thereby, a percentage of the number of samples in which the connection members form contact connection with the electrodes to the total number of samples of each comparative example is obtained, and a percentage of the number of samples in which the connection members form contact connection with the electrodes to the total number of samples of each embodiment is obtained.

Referring to the above Table 1, when the ML value (ML2) of the second encapsulation sub-layer is constant, the larger the ML value (ML1) of the first encapsulation sub-layer, the higher the percentage of the number of samples in which the connection members form contact connection with the electrodes to the total number of samples, that is, the lower the percentage of poor contact between the connection members and the electrodes (referring to Comparative examples 1 and 2 and Embodiments 1 to 3, or referring to Comparative examples 3 to 4 and Embodiments 4 to 6). When the ML value (ML1) of the first encapsulation sub-layer is greater than or equal to 0.4 dN·m, the number of samples in which the connection members form contact connection with the electrodes account for more than 95% of the total number of samples, that is, the photovoltaic module is a qualified product (referring to Embodiments 1 to 6). When the number of samples in which the connection members form contact connection with the electrodes account for smaller than 95% of the total number of samples, the photovoltaic module is not a qualified product (referring to Comparative examples 1~4). Therefore, setting the ML value of the first encapsulation sub-layer to be greater than 0.4 dN·m is beneficial to improving the yield and efficiency of photovoltaic modules.

Continuing to refer to Table 1 above, when the ML value (ML1) of the first encapsulation sub-layer is greater than or equal to 0.4 dN·m, a change of the ML value (ML2) of the second encapsulation sub-layer can no longer affect a connection state between the electrodes and the connection members (referring to Embodiments 1 and 4, or Embodiments 2 and 5, or Embodiments 3 and 6), that is, the first encapsulation sub-layer with poor flowability effectively isolates and blocks the second encapsulation sub-layer.

In other embodiments, referring to FIG. 1B, if the ML value of the first encapsulation sub-layer is defined as ML1, the ML value of the second encapsulation sub-layer is defined as ML2, and the ML value of the third encapsulation sub-layer is defined as ML3, the influence of the ML values of the first encapsulation sub-layer, the ML values of the second encapsulation sub-layer, and the ML values of the third encapsulation sub-layer on the connection state between the electrodes and the connection members after lamination is illustrated in following Table 2.

TABLE 2

| | Comparative examples | | Embodiments | | | | Comparative examples | Embodiments | | | |
|---|---|---|---|---|---|---|---|---|---|---|---|
| | 1 | 2 | 1 | 2 | 3 | 4 | 3 | 5 | 6 | 7 | 8 |
| ML1 (dN · m) | 0.1 | 0.3 | 0.4 | 0.6 | 0.6 | 0.8 | 0.1 | 0.4 | 0.6 | 0.6 | 0.8 |
| ML2 (dN · m) | 0.32 | 0.32 | 0.32 | 0.32 | 0.37 | 0.32 | 0.32 | 0.32 | 0.32 | 0.37 | 0.32 |

TABLE 2-continued

|  | Comparative examples | | Embodiments | | | | Comparative examples | Embodiments | | | |
|---|---|---|---|---|---|---|---|---|---|---|---|
|  | 1 | 2 | 1 | 2 | 3 | 4 | 3 | 5 | 6 | 7 | 8 |
| ML3 (dN · m) | 0.1 | 0.1 | 0.1 | 0.1 | 0.1 | 0.1 | 0.2 | 0.2 | 0.2 | 0.2 | 0.2 |
| Percentage of samples in which the connection members form contact connection with the electrodes to the total number of samples | 50% | 70% | 96% | 98% | 98% | 100% | 52% | 96% | 98% | 98% | 100% |

The data sources in Table 2 above are the same as those in Table 1 and will not be repeated here.

Referring to Table 2 above, when the ML value (ML2) of the second encapsulation sub-layer is constant, and the ML value (ML3) of the third encapsulation sub-layer is constant, the larger the ML value (ML1) of the first encapsulation sub-layer, the higher the percentage of the number of samples, in each of which the connection member forms contact connection with the electrode, to the total number of samples, i.e., the lower the proportion of poor contact between the connection member and the electrode (referring to Comparative example 1, Embodiments 1, 2 and 4, or referring to Comparative example 3, Embodiments 5, 6, and 8). When the ML value (ML1) of the first encapsulation sub-layer is greater than or equal to 0.4 dN·m, the number of samples, in each of which the connection member and the electrode form contact connection, accounts for more than 95% of the total number of samples, that is, the photovoltaic module is a qualified product (referring to Embodiments 1 to 8). When the ML value (ML1) of the first encapsulation sub-layer is smaller than 0.4 dN·m, the number of samples, in each of which the connection member and the electrode form contact connection, accounts for smaller than 95% of the total number of samples, and thus the photovoltaic module is an unqualified product (referring to Comparative examples 1 to 3). Therefore, setting the ML value of the first encapsulation sub-layer to be greater than 0.4 dN·m is beneficial to improving the yield and efficiency of photovoltaic modules.

Continuing to refer to the above Table 2, when the ML value (ML1) of the first encapsulation sub-layer is greater than or equal to 0.4 dN·m, a change of the ML value (ML2) of the second encapsulation sub-layer can no longer affect the connection state between the electrode and the connection member (referring to Embodiments 2 and 3, or Embodiments 6 and 7). That is, the first encapsulation sub-layer with poor flow effectively isolates and blocks the second encapsulation sub-layer. When the ML value (ML1) of the first encapsulation sub-layer is greater than or equal to 0.4 dN·m, a change of the ML value (ML3) of the third encapsulation sub-layer may not affect the connection state between the electrode and the connection member (referring to Embodiments 1 and 5, or Embodiments 2 and 6).

In some embodiments, referring to FIG. 1B, the ML value of the second encapsulation sub-layer 132 ranges from 0.3 dN·m to 0.4 dN·m, for example, the ML value of the second encapsulation sub-layer 132 is 0.32 dN·m. 0.35 dN·m. 0.36 dN·m. 0.38 dN·m. 0.39 dN·m, or the like. If the ML value of the second encapsulation sub-layer 132 is too small, the flowability of the second encapsulation sub-layer 132 is too close to that of the third encapsulation sub-layer 133, so that the second encapsulation sub-layer 132 may not serve as a good connection bridge between the first encapsulation sub-layer 131 and the third encapsulation sub-layer 133, that is, the bonding strength between the first encapsulation sub-layer 131 and the second encapsulation sub-layer 132 is reduced. If the ML of the second encapsulation sub-layer 132 is too large, the flowability of the second encapsulation sub-layer 132 is too close to that of the first encapsulation sub-layer 131, so that the second encapsulation sub-layer 132 may not serve as a good connection bridge between the first encapsulation sub-layer 131 and the third encapsulation sub-layer 133, that is, the bonding strength between the third encapsulation sub-layer 133 and the second encapsulation sub-layer 132 is reduced. Therefore, by setting the ML value of the second encapsulation sub-layer 132 to be in a range of 0.3 dN·m to 0.4 dN·m, it is advantageous to ensure a higher bonding strength between the first encapsulation sub-layer 131 and the second encapsulation sub-layer 132, and to ensure a higher bonding strength between the second encapsulation sub-layer 132 and the third encapsulation sub-layer 133.

In some embodiments, referring to FIG. 1B, the ML value of the third encapsulation sub-layer 133 ranges from 0.1 dN·m to 0.3 dN·m, for example, the ML value of the third encapsulation sub-layer 133 is 0.12 dN·m, 0.15 dN·m, 0.2 dN·m, 0.25 dN·m, or 0.3 dN·m, etc. The flowability of the third encapsulation sub-layer is too small, which may lead to poor adhesion and fixing ability of the third encapsulation sub-layer in the laminated photovoltaic module. Therefore, setting the ML value of the third encapsulation sub-layer to be in a range of 0.1 dN·m to 0.3 dN·m is beneficial to ensure the high bonding strength of the third encapsulation sub-layer.

Figure 4A:
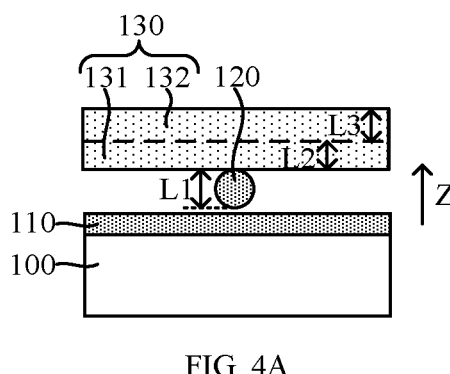
FIG. 4A is a partial cross-sectional structural view of a photovoltaic module before lamination according to an embodiment of the disclosure.
Figure 4B:
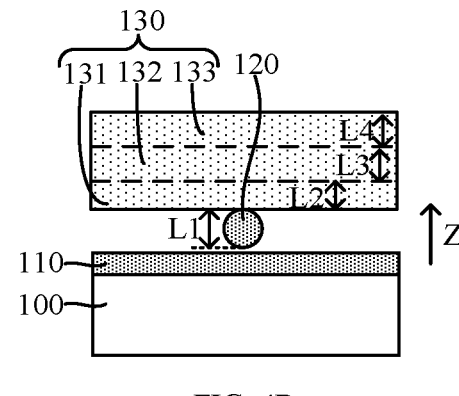
FIG. 4B is a partial cross-sectional structural view of a photovoltaic module before lamination according to another embodiment of the disclosure.

FIG. 4A is a partial cross-sectional structural view of a photovoltaic module before lamination according to an embodiment of the disclosure. FIG. 4B is a partial cross-sectional structural view of a photovoltaic module before lamination according to another embodiment of the disclosure.

In some embodiments, referring to FIGS. 4A and 4B, in a direction from the solar cell 100 to the encapsulation layer 130, i.e., in a Z direction shown in FIGS. 4A and 4B, a ratio of a thickness L2 of the first encapsulation sub-layer 131 to a maximum thickness L1 of the connection member 120 range from 0.4 to 1. For example, the ratio of the thickness L2 to the maximum thickness L1 is 0.4, 0.5, 0.6, 0.7, 0.9, or the like. If the ratio of the thickness L2 of the first encapsulation sub-layer 131 to the maximum thickness L1 of the connection member 120 is too large, the thickness L2 of the first encapsulation sub-layer 131 may be too large, and the light absorption of the solar cell 100 may be affected by the large thickness of the first encapsulation sub-layer 131. If the ratio of the thickness L2 of the first encapsulation sub-layer 131 to the maximum thickness L1 of the connection member 120 is too small, the thickness L2 of the first encapsulation sub-layer 131 may be too small. In the scorch stage of the encapsulation layer in the lamination process, the first encapsulation sub-layer 131 may not be able to block the second encapsulation sub-layer 132 well, so that the second encapsulation sub-layer 132 can flow between the electrodes 110 and the connection members 120. Therefore, by setting the ratio of the thickness L2 of the first encapsulation sub-layer 131 to the maximum thickness L1 of the connection member 120 to be in a range of 0.4 to 1, it is beneficial to prevent the excessively thick first encapsulation sub-layer 131 from shielding illumination, that is, it is beneficial to ensure that the solar cell 100 has a high illumination utilization rate. In addition, it is advantageous to ensure that the first encapsulation sub-layer 131 effectively blocks the second encapsulation sub-layer 132, thereby facilitating formation of good contact between the electrodes 110 and the connection members 120.

In some embodiments, referring to FIG. 4A, in the direction from the solar cell 100 to the encapsulation layer 130, a ratio of the thickness L2 of the first encapsulation sub-layer 131 to a thickness L3 of the second encapsulation sub-layer 132 ranges from 0.3 to 1.5. For example, the ratio of the thickness L2 to the thickness L3 may be 0.4, 0.5, 0.6, 0.7, or 1.2, or the like. In a case where the thickness L2 of the first encapsulation sub-layer 131 is fixed, if the ratio of the thickness L2 of the first encapsulation sub-layer 131 to the thickness L3 of the second encapsulation sub-layer 132 is too large, the thickness L3 of the second encapsulation sub-layer 132 is too small. Since the second encapsulation sub-layer 132 after lamination has high bonding strength, the second encapsulation sub-layer 132 with relatively small thickness may not provide good encapsulation protection for the solar cell 100, which may lead to the separation of the cover plate from the solar cell 100. In addition, the second encapsulation sub-layer 132 having relatively small thickness may cause the overall thickness of the encapsulation layer 130 to be too small, which may cause moisture to enter the solar cell 100 and cause failure of the solar cell 100. When the thickness L2 of the first encapsulation sub-layer 131 is fixed, if the ratio of the thickness L2 of the first encapsulation sub-layer 131 to the thickness L3 of the second encapsulation sub-layer 132 is too small, the thickness L3 of the second encapsulation sub-layer 132 may be relatively large, and the second encapsulation sub-layer 132 with relatively large thickness may affect the light absorption of the solar cell 100. In addition, the relatively thick second encapsulation sub-layer 132 may cause an increase in the manufacturing cost of the photovoltaic module. Therefore, by setting the ratio of the thickness L2 of the first encapsulation sub-layer 131 to the thickness L3 of the second encapsulation sub-layer 132 to be in a range of 0.3 to 1.5, it is not only beneficial to ensure that the second encapsulation sub-layer 132 performs good encapsulation protection on the solar cell 100, but also beneficial to enhancing the illumination utilization rate of the solar cell 100. Furthermore, it is also beneficial to make the material consumption for preparing the second encapsulation sub-layer 132 reasonable, such that the lightweight of the photovoltaic module can be achieved, and the preparation cost of the photovoltaic module can be reduced.

In some embodiments, referring to FIG. 4B, a ratio of a thickness L2 of the first encapsulation sub-layer 131 to a thickness L3 of the second encapsulation sub-layer 132 in the Z direction ranges from 1 to 4, for example, the ration of the thickness L2 to the thickness L3 is 1, 2, 2.5, 3, or the like. When the thickness L2 of the first encapsulation sub-layer 131 is fixed, if the ratio of the thickness L2 of the first encapsulation sub-layer 131 to the thickness L3 of the second encapsulation sub-layer 132 is too large, the thickness L3 of the second encapsulation sub-layer 132 may be small, and the relatively thin second encapsulation sub-layer 132 may not serve as a good connection bridge between the first encapsulation sub-layer 131 and the third encapsulation sub-layer 133. In addition, the relatively thin second encapsulation sub-layer 132 may cause the overall thickness of the encapsulation layer 130 to be too small, which may cause water vapor to enter the solar cell 100 and cause failure of the solar cell 100. When the thickness L2 of the first encapsulation sub-layer 131 is fixed, if the ratio of thickness L2 of the first encapsulation sub-layer 131 to the thickness L3 of the second encapsulation sub-layer 132 is too small, the thickness L3 of the second encapsulation sub-layer 132 may be relatively large, and the second encapsulation sub-layer 132 with large thickness may affect the light absorption of the solar cell 100. In addition, the relatively thick second encapsulation sub-layer 132 may cause an increase in the manufacturing cost of the photovoltaic module. Therefore, by setting the ratio of the thickness L2 of the first encapsulation sub-layer 131 to the thickness L3 of the second encapsulation sub-layer 132 to be in a range of 1 to 4, good encapsulation protection can be provided on the solar cell 100 by the second encapsulation sub-layer 132, and the illumination utilization rate of the solar cell 100 can be enhanced. In addition, the material consumption for preparing the second encapsulation sub-layer 132 is reasonable, which is beneficial to realizing the lightweight of the photovoltaic module and reducing the preparation cost of the photovoltaic module.

In some embodiments, referring to FIG. 4B, a ratio of a thickness L3 of the second encapsulation sub-layer 132 to a thickness L4 of the third encapsulation sub-layer 133 in the Z direction ranges from 0.2 to 0.7. For example, the ratio of the thickness L3 of the second encapsulation sub-layer 132 to the thickness L4 of the third encapsulation sub-layer 133 in the Z direction may be 0.3, 0.4, 0.5, 0.6, 0.7, or the like. In the case where the thickness L3 of the second encapsulation sub-layer 132 is fixed, if the ratio of the thickness L3 of the second encapsulation sub-layer 132 to the thickness L4 of the third encapsulation sub-layer 133 is too large, the thickness L4 of the third encapsulation sub-layer 133 is too small. Since the third encapsulation sub-layer 133 after lamination has high bonding strength, the third encapsulation sub-layer 133 with too small thickness may not provide good encapsulation protection for the solar cell 100, which may lead to the separation of the cover plate from the solar cell 100. Moreover, the third encapsulation sub-layer 133 having a relatively small thickness may cause the overall thickness of the encapsulation layer 130 to be small and may cause water vapor (moisture) to enter the solar cell 100 and cause the solar cell 100 to fail. When the thickness L3 of the second encapsulation sub-layer 132 is fixed, if the ratio of the thickness L3 of the second encapsulation sub-layer 132 to the thickness L4 of the third encapsulation sub-layer 133 is too small, the thickness LA of the third encapsulation sub-layer 133 may be relatively large, and the relatively thick third encapsulation sub-layer 133 may affect the light absorption of the solar cell 100. In addition, the relatively thick third encapsulation sub-layer 133 may cause an increase in the manufacturing cost of the photovoltaic module. Therefore, by setting the ratio of the thickness L3 of the second encapsulation sub-layer 132 to the thickness LA of the third encapsulation sub-layer 133 to be in a range of 0.2 to 0.7, the third encapsulation sub-layer 133 may provide good encapsulation protection for the solar cell 100, the illumination utilization rate of the solar cell 100 may be enhanced. Furthermore, the material consumption for preparing the third encapsulation sub-layer 133 is reasonable, which is beneficial to realizing the lightweight of the photovoltaic module and reducing the preparation cost of the photovoltaic module.

It is to be noted that in embodiments of the disclosure, the maximum thickness L1 of the connection member 120 is a thickness of the connection member 120 before lamination, the thickness L2 of the first encapsulation sub-layer 131 is a thickness of the first encapsulation sub-layer 131 before lamination, the thickness L3 of the second encapsulation sub-layer 132 is a thickness of the second encapsulation sub-layer 132 before lamination, and the thickness L4 of the third encapsulation sub-layer 133 is a thickness of the third encapsulation sub-layer 133 before lamination.

In some embodiments, referring to FIGS. 4A and 4B, the maximum thickness L1 of the connection member 120 in the Z direction ranges from 200 μm to 260 μm, for example, may be 200 μm, 210 μm. 230 μm, 235 μm, or 250 μm. If the maximum thickness L1 of the connection member 120 is too large, the connection member 120 may use too much material, thereby causing an increase in the cost of the photovoltaic module. If the maximum thickness L1 of the connection member 120 is too small, the conductive cross-sectional area of the connection member 120 may be small, and thus the resistance loss may be large. Therefore, setting the maximum thickness L1 of the connection member 120 to be in a range of 200 μm to 260 μm is beneficial to ensuring that the size of the connection member 120 is within a reasonable range, avoiding increasing the cost of the photovoltaic module, reducing the resistance loss, and further improving the efficiency of the photovoltaic module.

In some embodiments, referring to FIGS. 1A and 1B and FIGS. 4A and 4B, the thickness L2 of the first encapsulation sub-layer 131 in the Z direction ranges from 110 μm to 200 μm, for example, 120 μm, 130 μm, 150 μm, 165 μm, or 180 μm. The relatively thick first encapsulation sub-layer 131 may affect the light absorption of the solar cell 100. If the thickness L2 of the first encapsulation sub-layer 131 is too small, the first encapsulation sub-layer 131 may not be able to well block the second encapsulation sub-layer 132 which has higher flowability in the scorch stage of the encapsulation layer in the lamination process, such that the second encapsulation sub-layer 132 may flow between the electrodes 110 and the connection members 120. Therefore, by setting the thickness L2 of the first encapsulation sub-layer 131 to be in a range of 110 μm to 200 μm, it is beneficial to prevent the relatively thick first encapsulation sub-layer 131 from shielding illumination, that is, it is beneficial to ensure that the solar cell 100 has a higher utilization rate of illumination. In addition, it is advantageous to ensure that the first encapsulation sub-layer 131 effectively blocks the second encapsulation sub-layer 132, thereby facilitating the formation of good contact between the electrode 110 and the connection member 120.

In some embodiments, referring to FIGS. 1A and 4A, the thickness L3 of the second encapsulation sub-layer 132 in the Z direction ranges from 140 μm to 320 μm, for example, 150 μm, 165 μm, 170 μm, 200 μm, or 250 μm. If the thickness of the second encapsulation sub-layer 132 is too small, the solar cell 100 may not be well encapsulated and protected, which may lead to the separation of the cover plate from the solar cell 100. In addition, the second encapsulation sub-layer 132 having a relatively small thickness may cause the overall thickness of the encapsulation layer 130 to be too small, which may cause water vapor to enter the solar cell 100 and cause the solar cell 100 to fail. The relatively thick second encapsulation sub-layer 132 may affect the light absorption of the solar cell 100. In addition, the relatively thick second encapsulation sub-layer 132 may cause an increase in the manufacturing cost of the photovoltaic module. Therefore, the thickness L3 of the second encapsulation sub-layer 132 is set to be in a range of 140 mum to 320 mum, good encapsulation protection can be provided for the solar cell 100 by the second encapsulation sub-layer 132, and the illumination utilization rate of the solar cell 100 can be enhanced. Furthermore, the material consumption for preparing the second encapsulation sub-layer 132 is reasonable, which is not only beneficial to realizing the lightweight of the photovoltaic module, but also beneficial to reducing the preparation cost of the photovoltaic module.

In some embodiments, referring to FIGS. 1B and 4B, the thickness L3 of the second encapsulation sub-layer 132 in the Z direction ranges from 50 μm to 100 μm, for example, 60 μm, 70 μm, 80 μm, or 90 μm. The second encapsulation sub-layer 132 with a relatively small thickness may not serve as a good connection bridge between the first encapsulation sub-layer 131 and the third encapsulation sub-layer 133. In addition, the relatively thin second encapsulation sub-layer 132 may cause the overall thickness of the encapsulation layer 130 to be too small, which may cause water vapor to enter the solar cell 100 and cause the solar cell 100 to fail. If the second encapsulation sub-layer 132 is relatively thick, the light absorption of the solar cell 100 may be affected. In addition, the relatively thick second encapsulation sub-layer 132 may cause an increase in the manufacturing cost of the photovoltaic module. Therefore, the thickness L3 of the second encapsulation sub-layer 132 is set to be in a range of 50 μm to 100 μm, good encapsulation protection can be provided for the solar cell 100 by the second encapsulation sub-layer 132, and the illumination utilization rate of the solar cell 100 can be enhanced. In addition, the material consumption for preparing the second encapsulation sub-layer 132 is reasonable, which is beneficial to realizing the lightweight of the photovoltaic module and reducing the preparation cost of the photovoltaic module.

In some embodiments, referring to FIGS. 1B and 4B, the thickness LA of the third encapsulation sub-layer 133 in the direction from the solar cell 100 to the encapsulation layer 130, i.e., in the Z direction shown in FIG. 4B, ranges from 140 μm to 260 μm, for example, 150 μm, 165 μm, 170 μm, 200 μm, or 250 μm. If the thickness of the third encapsulation sub-layer is relatively small, the third encapsulation sub-layer may not provide good encapsulation protection for the solar cell 100, which may lead to the separation of the cover plate from the solar cell 100. Moreover, the relatively small third encapsulation sub-layer 133 may cause the overall thickness of the encapsulation layer 130 to be too small and may cause water vapor to enter the solar cell 100 and cause the solar cell 100 to fail. The relatively thick third encapsulation sub-layer 133 may affect the light absorption of the solar cell 100. In addition, the relatively thick third encapsulation sub-layer 133 may cause an increase in the manufacturing cost of the photovoltaic module. Therefore, the thickness L4 of the third encapsulation sub-layer 133 is set to be in a range of 140 μm to 260 μm, good packaging protection can be provided for the solar cell 100 by the third encapsulation sub-layer 133, and the illumination utilization rate of the solar cell 100 can be enhanced. Moreover, the material consumption for preparing the third encapsulation sub-layer 133 is reasonable, which is not only beneficial to realizing the lightweight of photovoltaic modules, but also beneficial to reducing the preparation cost of photovoltaic modules.

In some embodiments, referring to FIGS. 1A, 1B, and 2, the photovoltaic module further includes a plurality of glue dots 140. Each glue dot 140 is disposed between a corresponding solar cell 100 and a corresponding connection member 120, and the glue dot 140 is disposed on a part of a surface of the corresponding solar cell 100 outside the plurality of electrodes 110 (i.e., the glue dot 140 is not overlapped with the electrode 110 on the surface of the solar cell 100). The glue dot 140 is used for fixing the connection member 120 before lamination and preventing the connection member 120 from moving on the surface of the solar cell 100.

In some embodiments, referring to FIGS. 1A and 1B, the photovoltaic module further includes at least one cover plate 150. Each cover plate 150 is located on a surface of a corresponding encapsulation layer 130 away from the solar cell 100. The cover plate 150 is a glass cover plate or a plastic cover plate or the like for protecting cell strings.

In the photovoltaic module provided in the above embodiments, the encapsulation layer 130 includes a first encapsulation sub-layer 131 adjacent to the surface of the solar cell 100 and the connection members 120, and a second encapsulation sub-layer 132 away from the solar cell 100, where the flowability of the first encapsulation sub-layer 131 is smaller than that of the second encapsulation sub-layer 132, and the flowability of the first encapsulation sub-layer 131 and the flowability of the second encapsulation sub-layer 132 refer to the flowability at the lamination temperature. That is, the photovoltaic module is a photovoltaic module in the lamination process. At the lamination temperature, the first encapsulation sub-layer 131 adjacent to the connection member 120 and the solar cell 100 is set in a state with low flowability, so as to avoid the first encapsulation sub-layer 131 flowing between the connection members 120 and the electrodes 110, resulting in poor contact between the connection members 120 and the electrodes 110. In this way, it is beneficial to improving the efficiency and yield of the photovoltaic module. In addition, the first encapsulation sub-layer 131 is used to isolate the second encapsulation sub-layer 132 with relatively large flowability, and the second encapsulation sub-layer 132 with relatively large flowability is used to ensure that the encapsulation layer 130 has a large cross-linking degree, thereby ensuring that the encapsulation layer 130 can protect the solar cell well and improve the bonding strength between the encapsulation layer 130 and the cover plate, thus facilitating the prolongation of the service life of photovoltaic modules.

According to embodiments of the present disclosure, another aspect of the embodiments of the present disclosure also provides a method for manufacturing the photovoltaic module. The method can be used to form the photovoltaic module according to the above-mentioned embodiments. The method provided in the embodiments of the present disclosure may be described with reference to the accompanying drawings. It shall be noted that for the same or corresponding parts as the above-mentioned embodiments, reference may be made to the detailed description of the above-mentioned embodiments, and may not be described in detail below.

Figure 5:
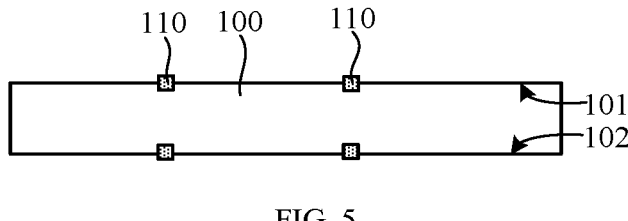
FIG. 5 is a schematic view illustrating a structure corresponding to an operation of providing solar cells in a method for manufacturing a photovoltaic module according to an embodiment of the disclosure.
Figure 6:
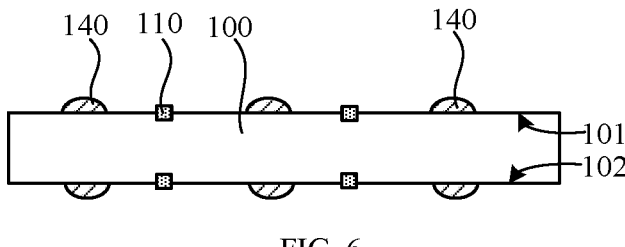
FIG. 6 is a schematic view illustrating a structure corresponding to an operation of forming glue dots in a method for manufacturing a photovoltaic module according to an embodiment of the disclosure.
Figure 7:
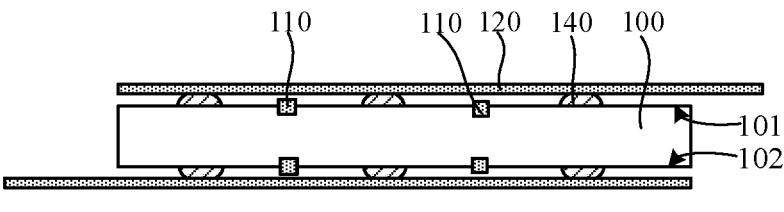
FIG. 7 is a schematic view illustrating a structure corresponding to an operation of fixing connection members by using glue dots in a method for manufacturing a photovoltaic module according to an embodiment of the disclosure.
Figure 8A:
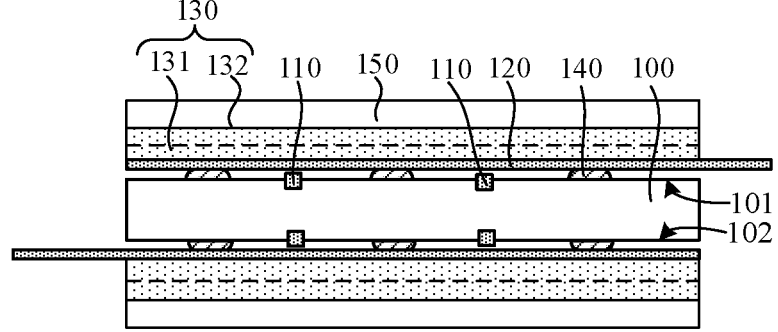
FIG. 8A is a schematic view illustrating a structure corresponding to an operation of providing at least one encapsulation layer in a method for manufacturing a photovoltaic module according to an embodiment of the disclosure.
Figure 8B:
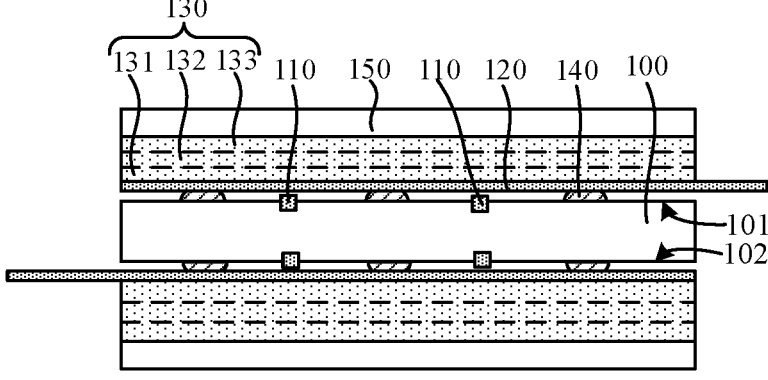
FIG. 8B is a schematic view illustrating a structure corresponding to an operation of providing at least one encapsulation layer in a method for manufacturing a photovoltaic module according to another embodiment of the disclosure.
Figure 9A:
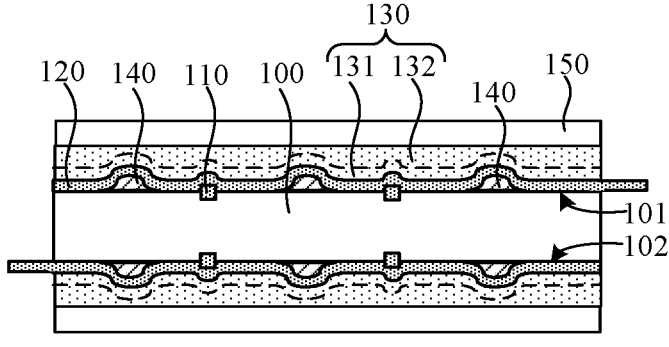
FIG. 9A is a schematic view illustrating a structure corresponding to a photovoltaic module after lamination in a method for manufacturing a photovoltaic module according to an embodiment of the disclosure.
Figure 9B:
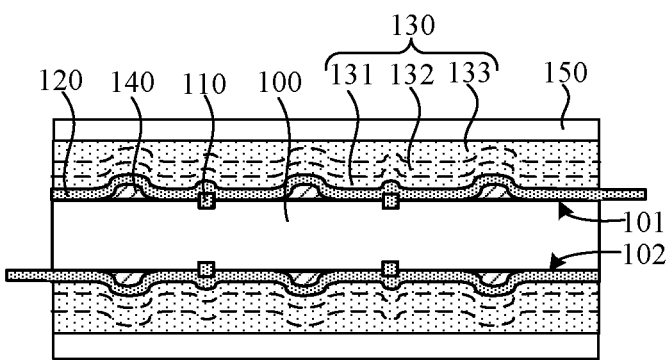
FIG. 9B is a schematic view illustrating a structure corresponding to a photovoltaic module after in a method for manufacturing a photovoltaic module according to an embodiment of the disclosure.

FIG. 5 is a schematic view illustrating a structure corresponding to an operation of providing solar cells in a method for manufacturing a photovoltaic module according to an embodiment of the disclosure. FIG. 6 is a schematic view illustrating a structure corresponding to an operation of forming glue dots in a method for manufacturing a photovoltaic module according to an embodiment of the disclosure. FIG. 7 is a schematic view illustrating a structure corresponding to an operation of fixing connection members by using glue dots in a method for manufacturing a photovoltaic module according to an embodiment of the disclosure. FIG. 8A is a schematic view illustrating a structure corresponding to an operation of providing at least one encapsulation layer in a method for manufacturing a photovoltaic module according to an embodiment of the disclosure. FIG. 8B is a schematic view illustrating a structure corresponding to an operation of providing at least one encapsulation layer in a method for manufacturing a photovoltaic module according to another embodiment of the disclosure. FIG. 9A is a schematic view illustrating a structure corresponding to a photovoltaic module after lamination in a method for manufacturing a photovoltaic module according to an embodiment of the disclosure. FIG. 9B is a schematic view illustrating a structure corresponding to a photovoltaic module after in a method for manufacturing a photovoltaic module according to an embodiment of the disclosure. It is to be noted that there is no restriction on the number of solar cells in the disclosure and FIGS. 5 to 9B just illustrate only one solar cell of the plurality of solar cells for illustrative.

Referring to FIG. 5, the method for manufacturing a photovoltaic module includes following operations. A plurality of solar cells 100 are provided. Each solar cell 100 includes a plurality of electrodes 110 on each surface of two opposite surfaces of the solar cell 100. In some embodiments, screen printing and sintering processes may be adopted to form the electrodes 110.

Referring to FIGS. 6 to 7, each connection member 120 is provided on a surface of a corresponding solar cell 100. For example, one end portion of each connection member 120 is disposed on the front surface of one of two respective adjacent solar cells 100, and another end portion of the each connection member 120 is disposed on the rear surface of the other of the two respective adjacent solar cells 100.

In some embodiments, during disposing the connection member 120, the method further includes forming glue dots 140. Referring to FIG. 6, uncured glue dots 140 may be formed on a portion of the surface of each solar cell 100 other than the plurality of electrodes 110. Referring to FIG. 7, the plurality of connection members 120 are laid on a surface of the plurality of solar cells 100, and the glue dots 140 are positioned between the portion of each solar cell 100 and the plurality of connection members 120. After the plurality of connection members 120 are laid, the glue dots 140 may be cured by ultraviolet light irradiation or other low-temperature treatment, and the plurality of connection members 120 can be fixed by the glue dots 140 to prevent the plurality of connection members 120 from moving.

Referring to FIG. 8A, at least one encapsulation layer 130 is provided on a surface of each solar cell 100, and the at least one encapsulation layer 130 is located on a side of each of the at least one connection member 120 away from the solar cell 100. Each encapsulation layer 130 includes a first encapsulation sub-layer 131 and a second encapsulation sub-layer 132 arranged sequentially in a direction away from the solar cell 100.

Alternatively, referring to FIG. 8B, at least one encapsulation layer 130 is provided on a surface of each solar cell 100. The at least one encapsulation layer 130 is located on a side of each of the at least one connection member 120 away from the solar cell 100. Each encapsulation layer 130 includes a first encapsulation sub-layer 131, a second encapsulation sub-layer 132, and a third encapsulation sub-layer 133 arranged sequentially in a direction away from the solar cell 100.

With continued reference to FIGS. 8A and 8B, in some embodiments, after the encapsulation layer 130 is provided, at least one cover plate 150 is disposed by disposing a corresponding cover plat on a surface of a respective encapsulation layer 130 away from the solar cell 100.

Referring to FIG. 9A, a lamination treatment is performed on the plurality of solar cells 100, the plurality of connection members 120, and the at least one encapsulation layer 130 at a preset temperature, so that each connection member 120 located above a corresponding electrode 110 is in contact with the corresponding electrode 110, and the plurality of solar cells 100 are fixed with the at least one encapsulation layer 130. The flowability of the first encapsulation sub-layer 131 at the preset temperature is smaller than that of the second encapsulation sub-layer 132 at the preset temperature.

Alternatively, referring to FIG. 9B, a lamination treatment is performed on the plurality of solar cells 100, the plurality of connection members 120, and the at least one encapsulation layer 130 at a preset temperature, so that each connection member 120 located above a corresponding electrode 110 is in contact with the corresponding electrode 110, and the plurality of solar cells 100 are fixed with the at least one encapsulation layer 130. The flowability of the third encapsulation sub-layer 133 at the preset temperature, the flowability of the second encapsulation sub-layer 132 at the preset temperature, and the flowability of the first encapsulation sub-layer 131 at the preset temperature are gradually reduced.

In some embodiments, the lamination treatment also enables that each encapsulation layer 130 is fixed to a corresponding cover plate 150.

The first encapsulation sub-layer 131 adjacent to the connection member 120 and the solar cell 100 is set in a state of low flowability, so that the first encapsulation sub-layer 131 is prevented from flowing between the connection members 120 and the electrodes 110, thereby avoiding poor contact between the connection member 120 and the electrode 110, which is beneficial to improving the efficiency and yield of photovoltaic modules. In addition, the second encapsulation sub-layer 132 with relatively large flowability is isolated by the first encapsulation sub-layer 131, and the bonding strength between the second encapsulation sub-layer 132 and the cover plate is ensured with the second encapsulation sub-layer 132 with relatively large flowability, so that the solar cell is well protected by the encapsulation layer 130, which is beneficial to prolonging the service life of photovoltaic modules. Alternatively, the second encapsulation sub-layer 132 and the third encapsulation sub-layer 133 which have relatively large flowability are isolated by the first encapsulation sub-layer 131, using the second encapsulation sub-layer 132 as a bridge between the first encapsulation sub-layer 131 and the third encapsulation sub-layer 133 is beneficial to increase the bonding strength between the first encapsulation sub-layer 131 and the third encapsulation sub-layer 133. In addition, the third encapsulation sub-layer 133 with the greatest flowability is beneficial to ensure the strong bonding strength between the encapsulation layer 130 and the cover plate, thus prolonging the service life of photovoltaic modules.

It shall be noted that the preset temperature may be higher than a temperature at which the connection member 120 and the electrode 110 are alloyed, and lower than a temperature at which the cross-linking reaction occurs in the encapsulation layer 130, so that alloying between the connection member 120 and the electrode 110 is achieved at the preset temperature, and the cross-linking reaction occurs in the encapsulation layer 130 after the connection member 120 and the electrode 110 are alloyed.

In the method for manufacturing the photovoltaic module provided in the above-described embodiment, the first encapsulation sub-layer 131 adjacent to the connection member 120 and the solar cell 100 is set in a state of low flowability, so that the first encapsulation sub-layer 131 is prevented from flowing between the connection member 120 and the electrode 110, resulting in poor contact between the connection members 120 and the electrodes 110, thereby facilitating the formation of a photovoltaic module with higher yield and efficiency. The first encapsulation sub-layer 131 is used to isolate the outer encapsulation layer 132 which has relatively large flowability, and the outer encapsulation layer 132 with high flowability ensures that the encapsulation layer 130 has a high cross linking degree, thereby ensuring that the encapsulation layer 130 protects the battery well, and improving the bonding strength between the encapsulation layer 130 and the cover plate, thereby facilitating the formation of a photovoltaic module with high structural stability.

It should be noted that, in the drawings provided in embodiments, the structure and the shape of the photovoltaic module do not constitute the limitation of the structure and the shape of the photovoltaic module in embodiments, and it shall be understood that the structure and the shape of the photovoltaic module can be designed and modified according to actual needs.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Those of ordinary skill in the art should appreciate that the embodiments described above are specific embodiments of the disclosure, and in practical application, various changes may be made thereto in form and detail without departing from the scope of the disclosure. Any one of those skilled in the art may make their own changes and modifications without departing from the scope of the present disclosure. Therefore, the protection scope of the disclosure shall be subject to the scope defined in the claims.

What is claimed is:

1. A photovoltaic module, comprising:
a plurality of solar cells, wherein a respective solar cell of the plurality of solar cells has a front surface and a rear surface opposite to the front surface, and each of the front surface and the rear surface has a plurality of electrodes formed thereon;
a plurality of connection members, wherein each connection member of the plurality of connection members is configured to connect two adjacent solar cells of the plurality of solar cells and has a first end portion disposed over the front surface of a first solar cell of the two adjacent solar cells and a second end portion disposed over the rear surface of a second solar cell of the two adjacent solar cells, and the first end portion is in contact with the plurality of electrodes on the front surface of the first solar cell, and the second end portion is in contact with the plurality of electrodes on the rear surface of the second solar cell; and
at least one encapsulation layer, wherein each encapsulation layer of the at least one encapsulation layer includes a first encapsulation sub-layer and a second encapsulation sub-layer, the first encapsulation sub-layer is adjacent to the plurality of connection members and portions of the plurality of solar cells not covered by the plurality of connection members, and the second encapsulation sub-layer is on a surface of the first encapsulation sub-layer facing away from the plurality of solar cells, wherein the first encapsulation sub-layer has flowability that is smaller than flowability of the second encapsulation sub-layer so that the first encapsulation sub-layer does not flow between the plurality of connection members and the plurality of electrodes; wherein a ratio of a minimum torque (ML) value of the first encapsulation sub-layer to a ML value of the second encapsulation sub-layer is in a range of 1.5 to 8.5.

2. The photovoltaic module of claim 1, wherein a ML value of the first encapsulation sub-layer is in a range of 0.4 dN·m to 0.85 dN·m, and a ML value of the second encapsulation sub-layer is in a range of 0.1 dN·m to 0.3 dN·m.

3. The photovoltaic module of claim 1, wherein the photovoltaic module further includes a plurality of glue dots, wherein each glue dot is disposed between a corresponding solar cell and a corresponding connection member and disposed on a part of a surface of the corresponding solar cell outside the plurality of electrodes.

4. The photovoltaic module of claim 1, wherein the first encapsulation sub-layer and the second encapsulation sub-layer are integrally formed.

5. The photovoltaic module of claim 1, wherein a ratio of a thickness of the first encapsulation sub-layer to a maximum thickness of each connection member of the plurality of connection members is in a range of 0.4 to 1, in a direction from the respective solar cell to a corresponding encapsulation layer of the at least one encapsulation layer.

6. The photovoltaic module of claim 1, wherein a ratio of a thickness of the first encapsulation sub-layer to a thickness of the second encapsulation sub-layer is in a range of 0.3 to 1.5, in a direction from the respective solar cell to a corresponding encapsulation layer of the at least one encapsulation layer.

7. The photovoltaic module of claim 1, wherein each encapsulation layer further includes a third encapsulation sub-layer disposed on a surface of the second encapsulation sub-layer away from the plurality of solar cells, wherein flowability of the third encapsulation sub-layer is larger than the flowability of the first encapsulation sub-layer and the flowability of the second encapsulation sub-layer.

8. The photovoltaic module of claim 7, wherein a ratio of a ML value of the first encapsulation sub-layer to a ML value of the second encapsulation sub-layer is in a range of 1.1 to 3, and a ratio of the ML value of the second encapsulation sub-layer to a ML value of the third encapsulation sub-layer is in a range of 1.1 to 4.

9. The photovoltaic module of claim 7, wherein a ML value of the first encapsulation sub-layer is in a range of 0.4 dN·m to 0.85 dN·m, a ML value of the second encapsulation sub-layer is in a range of 0.3 dN·m to 0.4 dN·m, and a ML value of the third encapsulation sub-layer is in a range of 0.1 dN·m to 0.3 dN·m.

10. The photovoltaic module of claim 7, wherein a ratio of a thickness of the first encapsulation sub-layer to a thickness of the second encapsulation sub-layer is in a range of 1 to 4 in a direction from the respective solar cell to a corresponding encapsulation layer of the at least one encapsulation layer.

11. The photovoltaic module of claim 7, a ratio of a thickness of the second encapsulation sub-layer to a thickness of the third encapsulation sub-layer is in a range of 0.2 to 0.7 in a direction from the respective solar cell to a corresponding encapsulation layer of the at least one encapsulation layer.

12. The photovoltaic module of claim 1, wherein the first encapsulation sub-layer and the second encapsulation sub-layer include a same material.

13. The photovoltaic module of claim 7, wherein the first encapsulation sub-layer, the second encapsulation sub-layer, and the third encapsulation sub-layer include a same material.

14. A method for manufacturing the photovoltaic module of claim 1, comprising:
providing the plurality of solar cells;
disposing the plurality of connection members by disposing the first end portion of each connection member over the front surface of the first solar cell of the two adjacent solar cells and disposing the second end portion of the each connection member over the rear surface of the second solar cell of the two adjacent solar cells;
disposing the at least one encapsulation layer by disposing the first encapsulation sub-layer of each encapsulation layer adjacent to the plurality of connection members and portions of the plurality of solar cells not covered by the plurality of connection members and disposing the second encapsulation sub-layer on a surface of the first encapsulation sub-layer facing away from the plurality of solar cells; and
performing a lamination treatment on the plurality of solar cells, the plurality of connection members, and the at least one encapsulation layer at a preset temperature, to enable the plurality of solar cells to be fixed with the at least one encapsulation layer.

15. The method of claim 14, wherein the method further comprises:

during disposing the plurality of connection members:

forming a plurality of glue dots, wherein each glue dot is disposed between a corresponding solar cell and a corresponding connection member and disposed on a part of a surface of the corresponding solar cell outside the plurality of electrodes.

16. The method of claim 14, wherein a ML value of the first encapsulation sub-layer is in a range of 0.4 dN·m to 0.85 dN·m, and a ML value of the second encapsulation sub-layer is in a range of 0.1 dN·m to 0.3 dN·m.

17. The method of claim 14, wherein each encapsulation layer further includes a third encapsulation sub-layer disposed on a surface of the second encapsulation sub-layer away from the plurality of solar cells, wherein flowability of the third encapsulation sub-layer is larger than the flowability of the first encapsulation sub-layer and the flowability of the second encapsulation sub-layer.

18. The method of claim 17, wherein a ML value of the first encapsulation sub-layer is in a range of 0.4 dN·m to 0.85 dN·m, a ML value of the second encapsulation sub-layer is in a range of 0.3 dN·m to 0.4 dN·m, and a ML value of the third encapsulation sub-layer is in a range of 0.1 dN·m~0.3 dN·m.

* * * * *